United States Patent
Imoto et al.

(10) Patent No.: US 9,219,159 B2
(45) Date of Patent: Dec. 22, 2015

(54) METHOD FOR FORMING OXIDE SEMICONDUCTOR FILM AND METHOD FOR MANUFACTURING SEMICONDUCTOR DEVICE

(75) Inventors: Yuki Imoto, Atsugi (JP); Tetsunori Maruyama, Atsugi (JP); Toru Takayama, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 361 days.

(21) Appl. No.: 13/422,241

(22) Filed: Mar. 16, 2012

(65) Prior Publication Data

US 2012/0244659 A1 Sep. 27, 2012

(30) Foreign Application Priority Data

Mar. 25, 2011 (JP) ................. 2011-067693

(51) Int. Cl.
*H01L 21/42* (2006.01)
*H01L 29/786* (2006.01)
*H01L 29/66* (2006.01)

(52) U.S. Cl.
CPC ...... *H01L 29/7869* (2013.01); *H01L 29/66969* (2013.01)

(58) Field of Classification Search
USPC ......................................................... 438/104
See application file for complete search history.

(56) References Cited

U.S. PATENT DOCUMENTS

| 749,220 | A | * | 1/1904 | Hikmet et al. ............... 604/287 |
| 5,528,032 | A | | 6/1996 | Uchiyama |
| 5,731,856 | A | | 3/1998 | Kim et al. |
| 5,744,864 | A | | 4/1998 | Cillessen et al. |

(Continued)

FOREIGN PATENT DOCUMENTS

| EP | 1737044 A | 12/2006 |
| EP | 2226847 A | 9/2010 |

(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — Jamie C Niesz
*Assistant Examiner* — Damian A Hillman
(74) *Attorney, Agent, or Firm* — Eric J. Robinson; Robinson Intellectual Property Law Office, P.C.

(57) ABSTRACT

A method for forming an oxide semiconductor film having favorable semiconductor characteristics is provided. In addition, a method for manufacturing a semiconductor device having favorable electric characteristics, with use of the oxide semiconductor film is provided. A method for forming an oxide semiconductor film including the steps of forming an oxide semiconductor film, forming a hydrogen permeable film over and in contact with the oxide semiconductor film, forming a hydrogen capture film over and in contact with the hydrogen permeable film, and releasing hydrogen from the oxide semiconductor film by performing heat treatment. Further, in a method for manufacturing a semiconductor device, the method for forming an oxide semiconductor film is used.

21 Claims, 9 Drawing Sheets

(56) References Cited

U.S. PATENT DOCUMENTS

| | | |
|---|---|---|
| 5,923,963 A | 7/1999 | Yamanaka |
| 6,191,452 B1 | 2/2001 | Oda et al. |
| 6,294,274 B1 | 9/2001 | Kawazoe et al. |
| 6,380,014 B1 | 4/2002 | Ohta et al. |
| 6,391,690 B2 | 5/2002 | Miyasaka |
| 6,555,419 B2 | 4/2003 | Oda et al. |
| 6,563,174 B2 | 5/2003 | Kawasaki et al. |
| 6,660,572 B2 | 12/2003 | Miyasaka |
| 6,727,522 B1 | 4/2004 | Kawasaki et al. |
| 6,803,265 B1 | 10/2004 | Ngo et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,132,716 B2 | 11/2006 | Moon et al. |
| 7,211,825 B2 | 5/2007 | Shih et al |
| 7,268,405 B2 | 9/2007 | Park et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,326,605 B2 | 2/2008 | Choi et al. |
| 7,374,998 B2 | 5/2008 | Hergenrother et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,459,220 B2 * | 12/2008 | Hikmet et al. ................. 428/690 |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,538,343 B2 | 5/2009 | Nam |
| 7,674,650 B2 | 3/2010 | Akimoto et al. |
| 7,732,819 B2 | 6/2010 | Akimoto et al. |
| 7,737,438 B2 | 6/2010 | Endo et al. |
| 7,791,072 B2 | 9/2010 | Kumomi et al. |
| 7,910,457 B2 | 3/2011 | Yamazaki |
| 7,910,490 B2 | 3/2011 | Akimoto et al. |
| 7,932,521 B2 | 4/2011 | Akimoto et al. |
| 8,018,012 B2 * | 9/2011 | Nakagawa et al. ............ 257/432 |
| 8,158,979 B2 | 4/2012 | Kang et al. |
| 8,384,076 B2 | 2/2013 | Park et al. |
| 8,384,078 B2 | 2/2013 | Kang et al. |
| 8,426,852 B2 | 4/2013 | Lee et al. |
| 8,461,597 B2 | 6/2013 | Kim et al. |
| 8,492,862 B2 * | 7/2013 | Yamazaki et al. ............ 257/430 |
| 2001/0002323 A1 | 5/2001 | Kobayashi et al. |
| 2001/0002325 A1 | 5/2001 | Oda et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2004/0229443 A1 * | 11/2004 | Bower ........................ 438/455 |
| 2005/0017302 A1 | 1/2005 | Hoffman |
| 2005/0116233 A1 | 6/2005 | Park et al. |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0192915 A1 * | 8/2006 | Kimura ........................ 349/151 |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292774 A1 | 12/2006 | Chen et al. |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0184619 A1 | 8/2007 | Hergenrother et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0067508 A1 | 3/2008 | Endo et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 * | 10/2008 | Park et al. ........................ 257/43 |
| 2008/0258143 A1 | 10/2008 | Kim et al. |
| 2008/0272370 A1 | 11/2008 | Endo et al. |
| 2008/0283916 A1 | 11/2008 | Yamazaki |
| 2008/0296568 A1 | 12/2008 | Ryu et al. |
| 2008/0308796 A1 | 12/2008 | Akimoto et al. |
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0068773 A1 | 3/2009 | Lai et al. |
| 2009/0073325 A1 | 3/2009 | Kuwabara et al. |
| 2009/0090914 A1 | 4/2009 | Yano et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0166616 A1 | 7/2009 | Uchiyama |
| 2009/0184305 A1 | 7/2009 | Lee et al. |
| 2009/0184396 A1 | 7/2009 | Kim et al. |
| 2009/0278122 A1 | 11/2009 | Hosono et al. |
| 2009/0280600 A1 | 11/2009 | Hosono et al. |
| 2009/0283763 A1 | 11/2009 | Park et al. |
| 2009/0302481 A1 | 12/2009 | Matsuzaki |
| 2009/0305461 A1 | 12/2009 | Akimoto et al. |
| 2009/0309102 A1 | 12/2009 | Kim et al. |
| 2010/0006810 A1 | 1/2010 | Kim et al. |
| 2010/0045179 A1 | 2/2010 | Sano et al. |
| 2010/0051938 A1 | 3/2010 | Hayashi et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0109058 A1 | 5/2010 | Sakata et al. |
| 2010/0136743 A1 | 6/2010 | Akimoto et al. |
| 2010/0233847 A1 | 9/2010 | Ohara et al. |
| 2010/0276694 A1 | 11/2010 | Sakakura et al. |
| 2010/0283049 A1 | 11/2010 | Sato et al. |
| 2010/0295041 A1 | 11/2010 | Kumomi et al. |
| 2011/0003418 A1 | 1/2011 | Sakata et al. |
| 2011/0006299 A1 | 1/2011 | Abe et al. |
| 2011/0009697 A1 | 1/2011 | Kawano et al. |
| 2011/0031497 A1 | 2/2011 | Yamazaki et al. |

(56) References Cited

U.S. PATENT DOCUMENTS

| | | |
|---|---|---|
| 2011/0053322 A1 | 3/2011 | Sasaki et al. |
| 2011/0068335 A1* | 3/2011 | Yamazaki et al. ............... 257/43 |
| 2011/0079777 A1 | 4/2011 | Akimoto |
| 2011/0101330 A1 | 5/2011 | Kang et al. |
| 2011/0104851 A1 | 5/2011 | Akimoto et al. |
| 2011/0117697 A1 | 5/2011 | Akimoto et al. |
| 2011/0121290 A1 | 5/2011 | Akimoto et al. |
| 2011/0127519 A1 | 6/2011 | Kang et al. |
| 2011/0133176 A1 | 6/2011 | Lee et al. |
| 2011/0136302 A1* | 6/2011 | Yamazaki et al. ............ 438/156 |
| 2011/0140097 A1* | 6/2011 | Cheong et al. ................... 257/43 |
| 2011/0140205 A1 | 6/2011 | Sakata et al. |
| 2011/0163311 A1 | 7/2011 | Akimoto et al. |
| 2011/0175080 A1 | 7/2011 | Kim et al. |
| 2011/0175830 A1 | 7/2011 | Sakata et al. |
| 2011/0204246 A1 | 8/2011 | Tanaka et al. |
| 2011/0220893 A1 | 9/2011 | Kim et al. |
| 2012/0132907 A1* | 5/2012 | Yamazaki et al. ............... 257/43 |
| 2012/0241736 A1 | 9/2012 | Imoto et al. |
| 2012/0241737 A1 | 9/2012 | Imoto et al. |
| 2012/0241738 A1 | 9/2012 | Imoto et al. |
| 2013/0264564 A1 | 10/2013 | Park et al. |
| 2013/0285044 A1 | 10/2013 | Yuan et al. |

FOREIGN PATENT DOCUMENTS

| | | | | |
|---|---|---|---|---|
| JP | 60-198861 A | 10/1985 | | |
| JP | 63-210022 | 8/1988 | | |
| JP | 63-210023 A | 8/1988 | | |
| JP | 63-210024 A | 8/1988 | | |
| JP | 63-215519 A | 9/1988 | | |
| JP | 63-239117 A | 10/1988 | | |
| JP | 63-265818 A | 11/1988 | | |
| JP | 05-251705 A | 9/1993 | | |
| JP | 06-275697 | 9/1994 | | |
| JP | 08-264794 A | 10/1996 | | |
| JP | 11-505377 | 5/1999 | | |
| JP | 2000-044236 A | 2/2000 | | |
| JP | 2000-150900 A | 5/2000 | | |
| JP | 2002-076356 A | 3/2002 | | |
| JP | 2002-289859 A | 10/2002 | | |
| JP | 2003-086000 A | 3/2003 | | |
| JP | 2003-086808 A | 3/2003 | | |
| JP | 2004-103957 A | 4/2004 | | |
| JP | 2004-273614 A | 9/2004 | | |
| JP | 2004-273732 A | 9/2004 | | |
| JP | 2004250295 A | * 9/2004 | ............... | C03C 3/21 |
| JP | 2006-165528 | 6/2006 | | |
| JP | 2007-096055 | 4/2007 | | |
| JP | 2007-123861 | 5/2007 | | |
| JP | 2008-141119 | 6/2008 | | |
| WO | WO-2004/114391 | 12/2004 | | |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits, 2008, vol. 43, No. 1, pp. 292-299.

(56) References Cited

OTHER PUBLICATIONS

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:AL and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.

Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display using In—Ga—Zn—Oxide TFTs with a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YbFe2O4, and Yb2Fe3O7 Types of Structures for Compounds in the In2O3 and Sc2O3-A2O3-BO Systems [A; Fe, Ga, or Al; B: Mg, Mn, Fe, Ni, Cu, or Zn] at Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08: SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

* cited by examiner

METHOD FOR FORMING OXIDE SEMICONDUCTOR FILM AND METHOD FOR MANUFACTURING SEMICONDUCTOR DEVICE

BACKGROUND OF THE INVENTION

1. Field of the Invention

The present invention relates to a method for forming an oxide semiconductor film and a method for manufacturing a semiconductor device with use of the method for forming an oxide semiconductor film.

In this specification, a semiconductor device generally refers to a device which can function by utilizing semiconductor characteristics; an electro-optical device, a semiconductor circuit, and an electronic device are all included in the category of the semiconductor device.

2. Description of the Related Art

In recent years, transistors which are used for many liquid crystal display devices and light-emitting display devices typified by flat panel displays have been formed over glass substrates and using a silicon semiconductor such as amorphous silicon or polycrystalline silicon.

Instead of the silicon semiconductor, a technique in which an oxide semiconductor that is a metal oxide having semiconductor characteristics is used for transistors has attracted attention.

For example, techniques in which a transistor manufactured using zinc oxide which is a single-component metal oxide or an In—Ga—Zn—O-based oxide which is a homologous compound as an oxide semiconductor is used as a switching element or the like of a pixel of a display device, is disclosed (see Patent Document 1 to Patent Document 3).

REFERENCE

Patent Documents

[Patent Document 1] Japanese Published Patent Application No. 2006-165528
[Patent Document 2] Japanese Published Patent Application No. 2007-096055
[Patent Document 3] Japanese Published Patent Application No. 2007-123861

SUMMARY OF THE INVENTION

When an oxide semiconductor film is formed, hydrogen that is not a constituent element of the oxide semiconductor film enters the oxide semiconductor film in some cases. Part of hydrogen in the oxide semiconductor film serves as a donor to cause generation of electrons that are carriers, which increases conductivity of the oxide semiconductor film. As described above, when hydrogen enter the oxide semiconductor film and conductivity is increased, a problem arises in semiconductor characteristics of the oxide semiconductor film.

For example, in a transistor in which an oxide semiconductor film including hydrogen and having increased conductivity is used for a channel formation region, the following problem occurs: the threshold voltage is shifted in the negative direction, and accordingly the drain current flows in a state where no voltage is applied to a gate electrode ($V_{gs}=0$ V). Note that in this specification, the drain current refers to a current flowing between a source electrode and a drain electrode. Furthermore, in this specification, the phenomenon in which the drain current flows in a state where no voltage is applied to the gate electrode ($V_{gs}=0$ V) is called normally-on.

In view of the above problem, an object of one embodiment of the present invention is to provide a method for forming an oxide semiconductor film having favorable semiconductor characteristics. Further, another object is to provide a method for manufacturing a semiconductor device having favorable electric characteristics, with use of the oxide semiconductor film.

The technical idea of the present invention is to release hydrogen included in the oxide semiconductor film by heat treatment and to transfer the hydrogen to a hydrogen capture film through a hydrogen permeable film. Note that the hydrogen is captured in the hydrogen capture film.

One embodiment of the present invention is a method for forming an oxide semiconductor film including the steps of forming an oxide semiconductor film, forming a film which is over and in contact with the oxide semiconductor film and through which hydrogen diffuses (a hydrogen permeable film), forming a film which is over and in contact with the hydrogen permeable film and captures the hydrogen (a hydrogen capture film), and releasing the hydrogen from the oxide semiconductor film by performing heat treatment.

Another embodiment of the present invention is a method for forming an oxide semiconductor film including the steps of forming an oxide semiconductor film, forming a hydrogen permeable film including an oxide to be over and in contact with the oxide semiconductor film, forming a hydrogen capture film which is over and in contact with the hydrogen permeable film, and releasing hydrogen from the oxide semiconductor film and supplying oxygen from the hydrogen permeable film to the oxide semiconductor film by performing heat treatment.

In the above process, after the heat treatment is performed, the hydrogen permeable film and the hydrogen capture film can be removed. Note that even after the hydrogen permeable film and the hydrogen capture film are removed, the amount of hydrogen contained in the oxide semiconductor film is small as long as the heat treatment has been performed.

A main component which is a metal element included in the hydrogen capture film is the same as a main component which is a metal element included in the oxide semiconductor film. The hydrogen permeable film does not include the metal element as a main component.

In the above, the hydrogen permeable film can be a silicon oxide film or a silicon oxynitride film, and the hydrogen capture film can be an oxiynitride film including indium (In). Note that in this specification, a silicon oxynitride film indicates a film in which the amount of oxygen is larger than that of nitrogen. Further, in this specification, an oxynitride film including In indicates a film in which In is contained and the amount of oxygen is larger than that of nitrogen, and particularly indicates a film formed by nitriding an oxide material.

That is, another embodiment of the present invention is a method for forming an oxide semiconductor film including the steps of forming an oxide semiconductor film, forming a silicon oxide film or a silicon oxynitride film over and in contact with the oxide semiconductor film, forming an oxynitride film including In over and in contact with the silicon oxide film or the silicon oxynitride film, and releasing hydrogen from the oxide semiconductor film by performing heat treatment.

The oxide semiconductor film can be formed using an In—Ga—Zn—O-based material which is a three-component metal oxide, and the oxynitride film including In can be formed by nitriding the In—Ga—Zn—O-based material. Note that in this specification, an oxide semiconductor film formed using an In—Ga—Zn—O-based material is referred to as an IGZO film (In—Ga—Zn—O film), and an oxynitride film formed by nitriding the In—Ga—Zn—O-based material is referred to as an IGZON film (In—Ga—Zn—O—N film).

Further, it is preferable that the hydrogen permeable film be formed thin so that hydrogen released from the oxide semiconductor film by heat treatment efficiently diffuses (penetrates). Specifically, in the case where the hydrogen permeable film is a silicon oxide film or a silicon oxynitride film, the film thickness is greater than or equal to 0.5 nm and less than or equal to 15 nm, preferably greater than or equal to 2 nm and less than or equal to 5 nm.

Further, by applying the method for forming the oxide semiconductor film from which hydrogen is released, a semiconductor device can be manufactured.

According to one embodiment of the present invention, a method for forming an oxide semiconductor film in which the amount of hydrogen contained can be reduced and which has favorable semiconductor characteristics can be provided. In addition, with use of the oxide semiconductor film, a method for manufacturing a semiconductor device having favorable electric characteristics can be provided.

DETAILED DESCRIPTION OF THE INVENTION

Figure 1A:
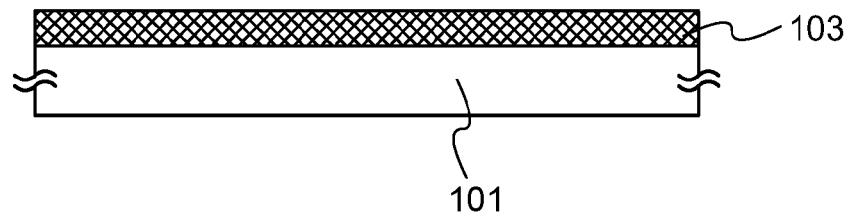
FIGS. 1A to 1D are cross-sectional views illustrating a method for forming an oxide semiconductor film according to one embodiment of the present invention.

Embodiments of the present invention will be described below with reference to the accompanying drawings. However, the invention is not limited to the description below, and it is easily understood by those skilled in the art that the mode and detail can be changed in various ways unless departing from the scope and spirit of the present invention. Therefore, the invention should not be construed as being limited to the description in the following embodiments. Note that the same portions or portions having the same function in the structure of the present invention described below are denoted by the same reference numerals in common among different drawings and repetitive description thereof will be omitted.

Note that in each drawing described in this specification, the size, the film thickness, or the region of each component is exaggerated for clarity in some cases. Therefore, embodiments of the present invention are not limited to such scales.

Note that terms such as "first", "second", and "third" in this specification are used in order to avoid confusion among components, and the terms do not limit the components numerically. Therefore, for example, the term "first" can be replaced with the term "second", "third", or the like as appropriate.

Note that functions of "source" and "drain" may be switched to each other in the case where a direction of a current flow is changed during circuit operation, for example. Therefore, the terms "source" and "drain" can be used to denote the drain and the source, respectively, in this specification.

In this specification, in the case where etching is performed using a resist mask, the resist mask is removed after the etching even there is no description of removal of the resist mask in this specification.

Note that in this specification, "on-state current" is current which flows between a source and a drain when a transistor is in a conduction state. For example, in the case of an n-channel thin film transistor, the on-state current is current which flows between a source and a drain when the gate voltage (a difference between a source potential and a gate potential when the potential of the source is used as a reference potential) of the transistor is higher than the threshold voltage thereof. In addition, "off-state current" is current which flows between a source and a drain without intention when a transistor is in a non-conduction state. For example, in the case of an n-channel thin film transistor, the off-state current is current which flows between a source and a drain when the gate voltage of the transistor is lower than the threshold voltage thereof.

(Embodiment 1)

In this embodiment, a method for forming an oxide semiconductor film of one embodiment of the present invention will be described. Specifically, a method for forming an oxide semiconductor film from which hydrogen is released will be described with reference to FIGS. 1A to 1D.

There is no particular limitation on a material and the like of a substrate 101 as long as the material has heat resistance high enough to withstand at least heat treatment performed later. For example, a glass substrate, a ceramic substrate, a quartz substrate, a sapphire substrate, or the like can be used as the substrate 101. Further alternatively, a single crystal semiconductor substrate or a polycrystalline semiconductor substrate made of silicon, silicon carbide, or the like, a compound semiconductor substrate made of silicon germanium or the like, an SOI substrate, or the like may be used as the substrate 101. Furthermore, any of these substrates provided with a semiconductor element may be used as the substrate 101. Moreover, a substrate which is formed using a metal material to have conductivity and on which an insulating film is formed may be used.

A flexible substrate may also be used as the substrate 101. In the case where a transistor is provided over a flexible substrate, an oxide semiconductor film according to one embodiment of the present invention may be directly formed on the flexible substrate. Alternatively, an oxide semiconductor film which has been formed over another substrate (substrate different from the flexible substrate) may be separated and transferred to the flexible substrate. Note that in order to separate the oxide semiconductor film and transfer it to the flexible substrate, it is preferable that a region where separation easily occurs be provided between the different substrate and the oxide semiconductor film.

Next, an oxide semiconductor film 103 is formed over the substrate 101 (see FIG. 1A). The oxide semiconductor film 103 is formed using a metal oxide having semiconductor characteristics. There is no particular limitation on crystallinity of the oxide semiconductor film 103, and an amorphous oxide semiconductor film, a single-crystal oxide semiconductor film, a polycrystalline oxide semiconductor film, or the like can be used.

The oxide semiconductor film 103 may be a c-axis aligned crystalline oxide semiconductor (CAAC-OS) film.

The CAAC-OS film is not completely single crystal nor completely amorphous. The CAAC-OS film is an oxide semiconductor film with a crystal-amorphous mixed phase structure where crystal parts and amorphous parts are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is the direction parallel to a normal vector of the surface where the CAAC-OS film is formed or a normal vector of the surface of the CAAC-OS film. The crystal part is formed by film formation or by performing treatment for crystallization such as heat treatment after film formation.

With use of the CAAC-OS film in a transistor, change in electric characteristics of the transistor due to irradiation with visible light or ultraviolet light can be reduced. Thus, the transistor has high reliability.

Note that part of oxygen included in the oxide semiconductor film may be substituted with nitrogen.

The oxide semiconductor film 103 may be formed by a sputtering method, a molecular beam epitaxy method, an atomic layer deposition method, or a pulsed laser deposition method. In consideration of the type of film to be formed and the formation time thereof, the oxide semiconductor film 103 may be formed to have a desired thickness.

As a metal oxide having semiconductor characteristics which can be used for the oxide semiconductor film 103, the following materials can be given. For example, a four-component metal oxide such as an In—Sn—Ga—Zn—O-based material; a three-component metal oxide such as an In—Ga—Zn—O-based material, an In—Sn—Zn—O-based material, an In—Al—Zn—O-based material, a Sn—Ga—Zn—O-based material, an Al—Ga—Zn—O-based material, or a Sn—Al—Zn—O-based material; a two-component metal oxide such as an In—Zn—O-based material, a Sn—Zn—O-based material, an Al—Zn—O-based material, a Zn—Mg—O-based material, a Sn—Mg—O-based material, an In—Mg—O-based material, or an In—Ga—O-based material; a single-component metal oxide such as an In—O-based material, a Sn—O-based material, or a Zn—O-based material; or the like may be used. Here, for example, an In—Ga—Zn—O-based material means oxide containing indium (In), gallium (Ga), and zinc (Zn), and there is no particular limitation on the composition ratio.

In the case where an In—Ga—Zn—O-based material is used for the oxide semiconductor film 103, a material with a composition ratio where $In_2O_3$:$Ga_2O_3$:ZnO=1:1:1 [molar ratio] can be used as an example of a metal oxide target containing In, Ga, and Zn. Alternatively, a target having a composition ratio where $In_2O_3$:$Ga_2O_3$:ZnO=1:1:2 [molar ratio], a target having a composition ratio where $In_2O_3$:$Ga_2O_3$:ZnO=1:1:4 [molar ratio], or a target having a composition ratio where $In_2O_3$:$Ga_2O_3$:ZnO=2:1:8 [molar ratio] can be used.

In the case where an In—Zn—O-based material is used as the oxide semiconductor film 103, the atomic ratio of In to Zn is higher than or equal to 0.5 and lower than or equal to 50, preferably higher than or equal to 1 and lower than or equal to 20, further preferably higher than or equal to 1.5 and lower than or equal to 15. When the atomic ratio of In to Zn is in the above range, the field-effect mobility of the transistor 100 can be improved. Here, when the atomic ratio of the compound is In:Zn:O=X:Y:Z, the relation Z>1.5X+Y is preferably satisfied.

Further, the In—Ga—Zn—O-based oxide semiconductor may contain an element other than In, Ga, and Zn. For example, a material represented by a chemical formula, $InMO_3(ZnO)_m$ (m>0) may be used as the oxide semiconductor film 103. Here, M represents one or more metal elements selected from Ga, Al, Mn, and Co. For example, M may be Ga, Ga and Al, Ga and Mn, Ga and Co, or the like.

Note that the same metal element as a metal element for forming the oxide semiconductor film 103 is preferably included in a hydrogen capture film that is formed later, and further, the hydrogen capture film is preferably an oxynitride film including In. Thus, as the oxide semiconductor film 103 in this embodiment, an IGZO film is formed using an In—Ga—Zn—O-based material by a sputtering method.

Although hydrogen in the oxide semiconductor film 103 can be removed by heat treatment performed later, the concentration of hydrogen contained in the oxide semiconductor film 103 is preferably reduced as much as possible when the oxide semiconductor film 103 is formed. Specifically, when the oxide semiconductor film 103 is formed by a sputtering method, for reducing the hydrogen concentration, oxygen, a high-purity rare gas (typically, argon) from which impurities such as hydrogen, water, a hydroxyl group, or a hydride is removed, or a mixed gas of the rare gas and oxygen may be used as appropriate as an atmosphere gas supplied to a treatment chamber of a sputtering apparatus. Furthermore, for evacuation of the treatment chamber, a combination of a cryopump having high capability in evacuating water and a sputter ion pump having high capability in evacuating hydrogen may be used.

With use of the above sputtering apparatus and the sputtering method, the oxide semiconductor film 103 in which the amount of contained hydrogen is small can be formed. Note that even when the sputtering apparatus and the sputtering method are used, the oxide semiconductor film 103 contains more than a little nitrogen. For example, the nitrogen concentration of the oxide semiconductor film 103, which is measured by secondary ion mass spectrometry (SIMS) is lower than $5\times10^{18}$ cm$^{-3}$.

A hydrogen permeable film 105 is formed over the oxide semiconductor film 103. The hydrogen permeable film 105 functions as a film through which hydrogen released from the oxide semiconductor film 103 by heat treatment performed later diffuses (penetrates). The hydrogen permeable film 105 may be a conductive film, an insulating film, or a semiconductor film for example as long as it can have the above function. As a method for forming the hydrogen permeable film 105, in addition to a method such as a sputtering method which can be used for formation of the oxide semiconductor film 103, a plasma CVD method may be used.

Here, a state in which the amount of oxygen is small as compared with oxygen of the stoichiometric proportion in the oxide semiconductor, i.e., oxygen deficiency in the oxide semiconductor, is described. During or after formation of an oxide semiconductor film, electric charge is generated owing to oxygen deficiency in the oxide semiconductor film in some cases. Part of oxygen deficienciy (vacancies) in the oxide semiconductor generally serves as a donor, which causes generation of electrons serving as a carrier and results in an increase of conductivity of the formed oxide semiconductor film. Accordingly, semiconductor characteristics of the formed oxide semiconductor film are degraded.

Thus, a film including oxide is used for the hydrogen permeable film 105, whereby oxygen can be supplied from the hydrogen permeable film 105 to the oxide semiconductor film 103 by heat treatment which is performed later for releasing hydrogen from the oxide semiconductor film 103. By supplying oxygen to the oxide semiconductor film 103, oxygen deficiency in the oxide semiconductor film 103 is reduced and generation of electrons serving as a carrier is suppressed accordingly. Specifically, a silicon oxide film or a silicon oxynitride film can be used as the film including oxide.

Further, it is preferable that the hydrogen permeable film 105 be formed thin so that hydrogen released from the oxide semiconductor film 103 by heat treatment performed later efficiently diffuses (penetrates). Specifically, in the case where the hydrogen permeable film 105 is a silicon oxide film or a silicon oxynitride film, the thickness may be greater than or equal to 0.5 nm and less than or equal to 15 nm, preferably greater than or equal to 2 nm and less than or equal to 5 nm.

Note that in this embodiment, as the hydrogen permeable film 105, a silicon oxide film is formed to a thickness of 5 nm by a sputtering method.

Figure 1B:
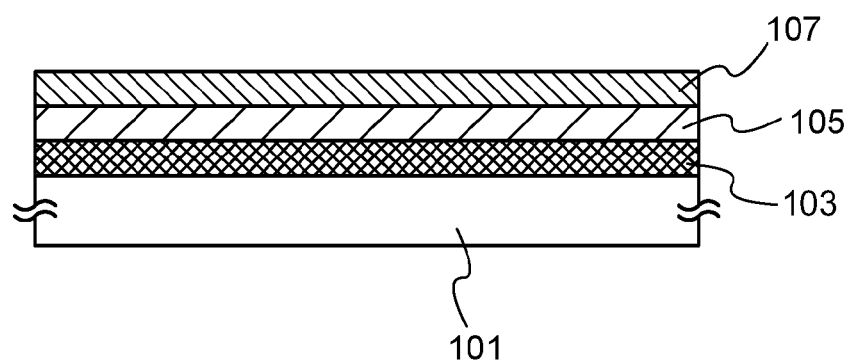

Next, a hydrogen capture film 107 is formed over the hydrogen permeable film 105. The structure obtained through the steps up to here is illustrated in FIG. 1B. The hydrogen capture film 107 is a film functioning to capture hydrogen which has been released from the oxide semiconductor film 103 by heat treatment and has diffused (penetrated) through the hydrogen permeable film 105. There is no particular limitation on a film which is applied to the hydrogen capture film 107 as long as the film has the above function, and for example, a conductive film, an insulating film, or a semiconductor film can be used. As a method for forming the hydrogen capture film 107, in addition to a method such as a sputtering method which can be used for formation of the oxide semiconductor film 103, a plasma CVD method may be used.

The hydrogen capture film 107 is preferably an oxynitride film including In. Specifically, the oxynitride film including In is a film formed using at least indium nitride and one or more materials of indium oxide, gallium oxide, zinc oxide, tin oxide, aluminum oxide, tungsten oxide, molybdenum oxide, titanium oxide, tantalum oxide, and silicon oxide. Further, the nitrogen concentration in the hydrogen capture film 107 is higher than or equal to 0.01 at. % and lower than or equal to 20 at. %. The nitrogen concentration can be quantified by X-ray photoelectron spectroscopy (XPS).

Further, the hydrogen capture film 107 is not limited to a semiconductor film as long as it is a film functioning to capture hydrogen which has been diffused (penetrated) through the hydrogen permeable film 105. A conductive film, or an insulating film can be used, for example.

In the case where the oxynitride film including In used for the hydrogen capture film 107 is formed by a sputtering method, a target including at least indium oxide is used and a nitriding gas is supplied. As the target, in addition to indium oxide, a material including at least one of gallium oxide, zinc oxide, tin oxide, aluminum oxide, tungsten oxide, molybdenum oxide, titanium oxide, tantalum oxide, and silicon oxide may be used. The nitriding gas contains at least nitrogen and may further contain at least one of a rare gas (such as helium, neon, argon, krypton, or xenon) and oxygen, in addition to nitrogen.

In particular, a main component of metal elements included in the oxide semiconductor film 103 may be the same as a main component of metal elements included in the hydrogen capture film 107. The hydrogen capture film 107 preferably contains a component of metal elements included in the oxide semiconductor film 103. Thus, the hydrogen capture film 107 can be formed using a metal oxide material the same as that included in the oxide semiconductor film 103. Therefore, in the case where the oxide semiconductor film 103 is the IGZO film, the hydrogen capture film 107 can be an IGZON film. Note that the IGZON film can be obtained by sputtering an IGZO target with a gas containing nitrogen supplied in a treatment chamber of an apparatus for formation of the IGZO film.

Further, in consideration of the type of film to be formed and the formation time thereof, the hydrogen capture film 107 may be formed to have a desired thickness. However, the hydrogen capture film 107 is preferably formed thick enough to efficiently capture hydrogen released from the oxide semiconductor film 103. Specifically, the thickness thereof may be greater than or equal to 10 nm and less than or equal to 500 nm.

Note that in this embodiment, as the hydrogen capture film 107, an IGZON film is formed to a thickness of 300 nm by a sputtering method.

The oxide semiconductor film 103, the hydrogen permeable film 105, and the hydrogen capture film 107 may be formed successively in vacuum. For example, after impurities including hydrogen attached on a surface of the substrate 101 is removed by heat treatment or plasma treatment, the oxide semiconductor film 103 may be formed without being exposed to air and continuously, the hydrogen permeable film 105 and the hydrogen capture film 107 may also be formed without being exposed to air. By successive film formation as the above, impurities including hydrogen attached on the surface of the substrate 101 is reduced, and attachment of an atmospheric component on an interface between the substrate 101 and the oxide semiconductor film 103, an interface between the oxide semiconductor film 103 and the hydrogen permeable film 105, and an interface between the hydrogen permeable film 105 and the hydrogen capture film 107 can be suppressed. As a result, hydrogen released from the oxide semiconductor film 103 by heat treatment performed later can be efficiently made to diffuse (penetrate) and captured.

Figure 1C:
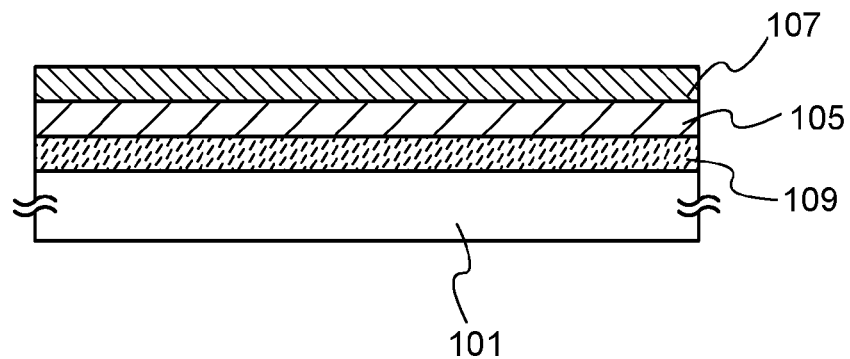

Next, heat treatment is performed on a structure obtained through the steps up to here. By performing heat treatment, hydrogen included in the oxide semiconductor film 103 can be released. The released hydrogen penetrates the hydrogen permeable film 105 and is captured by the hydrogen capture film 107. In other words, by performing the heat treatment, hydrogen included in the oxide semiconductor film 103 can be transferred to the hydrogen capture film 107. Therefore, by the heat treatment, a highly purified oxide semiconductor film 109 in which the hydrogen concentration is reduced is formed. The structure obtained through the steps up to here is illustrated in FIG. 1C.

In addition, the hydrogen permeable film 105 is formed between the oxide semiconductor film 103 and the hydrogen capture film 107, whereby the oxide semiconductor film 103 and the hydrogen capture film 107 are provided separately from each other. For example, in the case where the hydrogen capture film 107 is provided directly on the oxide semiconductor film 103, some of hydrogen released from the oxide semiconductor film 103 by heat treatment is left at an interface between the oxide semiconductor film 103 and the hydrogen capture film 107 without being captured by the hydrogen capture film 107, in some cases. However, when the hydrogen permeable film 105 is provided between the oxide semiconductor film 103 and the hydrogen capture film 107, hydrogen released from the oxide semiconductor film 103 by heat treatment can be transferred to the hydrogen capture film 107 without being left in the oxide semiconductor film 103, and accordingly the hydrogen concentration in the oxide semiconductor film 103 can be sufficiently reduced.

The temperature of the heat treatment is higher than 450° C. and lower than the strain point of the substrate 101, preferably, higher than or equal to 500° C. and lower than the strain point of the substrate 101, further preferably higher than or equal to 550° C. and lower than the strain point of the substrate 101. As the temperature is increased, the amount of hydrogen released from the oxide semiconductor film 103 is increased. Further, as the thickness of the oxide semiconductor film 103 formed over the substrate 101 is decreased, the temperature can be lowered.

There is no particular limitation on a heat treatment apparatus used for the heat treatment, and the apparatus may be provided with a device for heating an object to be processed by heat radiation or heat conduction from a heating element such as a resistance heating element. For example, an electric furnace, or a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas.

The hydrogen concentration of the oxide semiconductor film 109 formed by the heat treatment is lower than $1\times10^{19}$ $cm^{-3}$, preferably lower than or equal to $5\times10^{18}$ $cm^{-3}$. Note that the hydrogen concentration in the oxide semiconductor film 109 is a value that can be quantified by SIMS. In the oxide semiconductor film 109, the amount of hydrogen serving as a donor is reduced, and generation of electrons serving as a carrier is suppressed; thus the oxide semiconductor film 109 has favorable semiconductor characteristics.

Figure 1D:
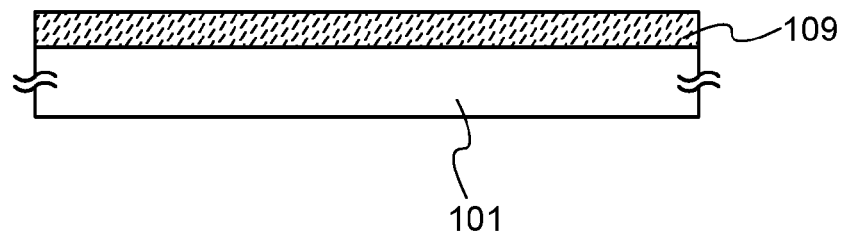

Further, when the oxide semiconductor film 109 obtained by the above method is applied to a semiconductor device, e.g., a channel formation region of a transistor, the hydrogen permeable film 105 and the hydrogen capture film 107 are removed as illustrated in FIG. 1D by etching, and then the transistor is manufactured.

Furthermore, a main component of metal elements included in the hydrogen capture film 107 may be the same component as a main component of metal elements included in the oxide semiconductor film 109, and the hydrogen capture film 107 and the oxide semiconductor film 109 can be formed using the same metal oxide material. Thus, in etching, the etching rate of the hydrogen capture film 107 and the etching rate of the oxide semiconductor film 109 are comparable to each other. However, constituent elements of the hydrogen permeable film 105 and the hydrogen capture film 107 are different from each other, and the constituent elements of the hydrogen permeable film 105 and the oxide semiconductor film 109 are different from each other. Thus, the etching rate of the hydrogen permeable film 105 and the etching rate of the hydrogen capture film 107 are different from each other, and the etching rate of the hydrogen permeable film 105 and the etching rate of the oxide semiconductor film 109 are different from each other. Therefore, when the hydrogen permeable film 105 and the hydrogen capture film 107 are removed, the etching selectivity of the hydrogen capture film 107 to the oxide semiconductor film 109 can be high. As a result, without excessive etching of the oxide semiconductor film 109, the hydrogen permeable film 105 and the hydrogen capture film 107 can be removed.

Specifically, in the case where the hydrogen permeable film 105, the hydrogen capture film 107, and the oxide semiconductor film 109 are respectively a silicon oxide film, an IGZON film, and an IGZO film, event though the etching rate of the IGZON film and the etching rate of the IGZO film are comparable to each other, the etching rate of the silicon oxide film and the etching rate of the IGZO film are different; thus, the etching selectivity of the silicon oxide film to the IGZO film can be high. As a result, without excessive etching of the IGZO film, the silicon oxide film and the IGZON film can be removed.

Here, a method for forming a CAAC-OS film as the oxide semiconductor film 103 is described.

As a method for forming a CAAC-OS film, there are two methods as follows. One of the methods is that formation of an oxide semiconductor film is performed once while the substrate is heated (a method (1)). The other of the methods is that a formation of the oxide semiconductor film is performed twice, and heat treatment is performed after each formation of the oxide semiconductor film (a method (2)).

First, the case where a CAAC-OS film is formed with use of the method (1) is described.

Over the substrate 101, the oxide semiconductor film 103 is formed while the substrate 101 is heated. Note that the oxide semiconductor film 103 may be formed as described above by a sputtering method, a molecular beam epitaxy method, an atomic layer deposition method, or a pulsed laser deposition method.

The temperature at which the substrate 101 is heated is set so that the temperature of the substrate 101 is higher than or equal to 150° C. and lower than or equal to 450° C., and preferably the temperature of the substrate 101 is higher than or equal to 200° C. and lower than or equal to 350° C.

The temperature of the substrate 101 is made high while the oxide semiconductor film 103 is formed, whereby the oxide semiconductor film 103 can be a CAAC-OS film in which the ratio of a crystal part to an amorphous part is high.

Next, the case where a CAAC-OS film is formed with use of the method (2) is described.

While the temperature of the substrate 101 is kept at a temperature higher than or equal to 200° C. and lower than or equal to 400° C., an oxide semiconductor film as a first layer (first oxide semiconductor film) is formed over the substrate 101, and then heat treatment is performed at a temperature higher than or equal to 550° C. and lower than the strain point of the substrate 101 in an atmosphere of nitrogen, oxygen, a rare gas, or dry air. By the heat treatment, a crystalline region (including plate-like crystal) is formed in a region including a top surface of the first oxide semiconductor film. Then, an oxide semiconductor film as a second layer (a second oxide semiconductor film) is formed thicker than the first oxide semiconductor film. After that, heat treatment is performed again at a temperature higher than or equal to 550° C. and lower than the strain point of the substrate 101. By the heat treatment, crystal growth occurs upwardly with use of the first oxide semiconductor film including a crystalline region (including plate-like crystal) as a seed for the crystal growth, and accordingly the whole region including a top surface of the second oxide semiconductor film is crystallized. Note that the first oxide semiconductor film and the second oxide semiconductor film may be formed using the above-described metal oxide material which can be applied to the oxide semiconductor film 103. The thickness of the first oxide semiconductor film is preferably greater than or equal to 1 nm and less than or equal to 10 nm.

As described above, a hydrogen permeable film and a hydrogen capture film are formed over an oxide semiconductor film, and hydrogen is released from the oxide semiconductor film by performing heat treatment and is further captured by the hydrogen capture film, whereby an oxide semiconductor film in which the hydrogen concentration is lowered can be formed. That is, with use of the formation method described in this embodiment, an oxide semiconductor film having favorable semiconductor characteristics can be obtained.

Note that the structure described in this embodiment can be used in appropriate combination with structures described in the other embodiments and example of this specification.
(Embodiment 2)

In this embodiment, a method for manufacturing a semiconductor device, to which the method for forming an oxide semiconductor film described in Embodiment 1 is applied, will be described. Here, a method for manufacturing a transistor is described as an example.

There is no particular limitation on a structure of a transistor to which the method for forming an oxide semiconductor film described in Embodiment 1 is applied. Any of a top gate structure, a bottom gate structure or a dual gate structure can be employed. Specifically, any of a top-gate top-contact structure, a top-gate bottom-contact structure, a bottom-gate top-contact structure, or a bottom-gate bottom-contact structure can be employed.

In this embodiment, as an example, the case where the method for forming an oxide semiconductor film described in Embodiment 1 is applied to a top-gate top-contact transistor is described. Note that the transistor is referred to as a transistor 100, and a structure and a manufacturing method of the transistor 100 will be described with the reference numerals used in Embodiment 1 as appropriate.

Figure 2A:
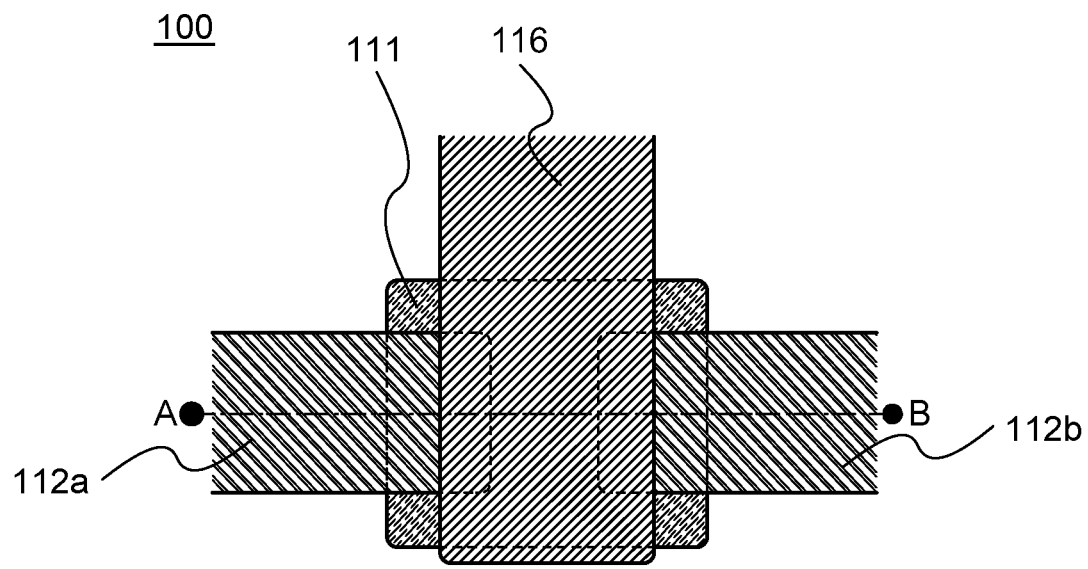
FIGS. 2A and 2B are a top view and a cross-sectional view illustrating a semiconductor device according to one embodiment of the present invention.
Figure 2B:
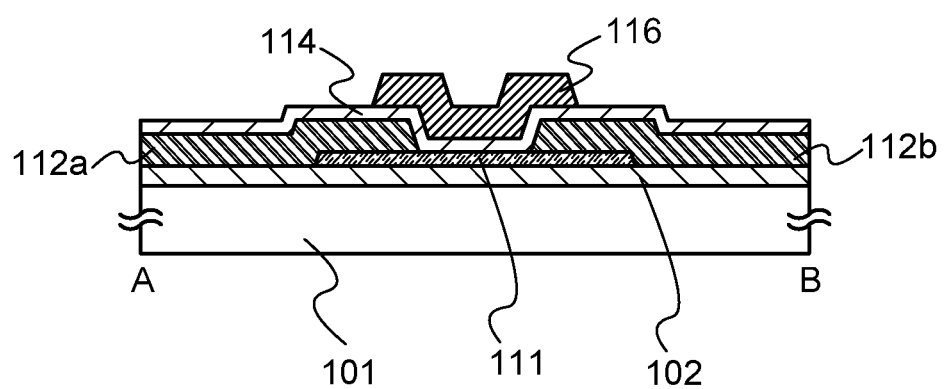

FIG. 2A is a top view of the transistor 100. FIG. 2B is a cross-sectional view along dashed-dotted line A-B in FIG. 2A.

In the transistor 100, a base insulating film 102 is provided over the substrate 101, an oxide semiconductor film 111 is provided over the base insulating film 102, a source electrode 112a and a drain electrode 112b are provided to be in contact with part of top and side surfaces of the oxide semiconductor film 111, a gate insulating film 114 is provided over the oxide semiconductor film 111, the source electrode 112a, and the drain electrode 112b, and a gate electrode 116 is provided over the gate insulating film 114 to overlap with the oxide semiconductor film 111. Note that the base insulating film 102 and the gate insulating film 114 are not illustrated in FIG. 2A for simplicity.

A method for manufacturing the transistor 100 is described with reference to FIGS. 3A to 3E.

The substrate 101 is similar to that of Embodiment 1, and the substrate 101 is a glass substrate here.

Next, the base insulating film 102 is formed over the substrate 101. The base insulating film 102 is formed to have a single-layer structure or a stacked-layer structure using any of materials described below. The base insulating film 102 can be formed by a sputtering method, a CVD method, a coating method, or the like. Note that the thickness of the base insulating film 102 is preferably, but not limited to, greater than or equal to 50 nm. The base insulating film 102 prevents diffusion of impurities (e.g., an alkali metal such as Li or Na) from the substrate 101 and etching of the substrate 101 in an etching step in a manufacturing process of the transistor 100.

As a material of the base insulating film 102, any of insulating films selected from oxide insulating films such as a silicon oxide film, a gallium oxide film, and an aluminum oxide film; nitride insulating films such as a silicon nitride film and an aluminum nitride film; a silicon oxynitride film; an aluminum oxynitride film; and a silicon nitride oxide film can be used. Note that the base insulating film 102 preferably contains oxygen in a portion in contact with the oxide semiconductor film 109 formed later.

In this specification, silicon oxynitride refers to a substance that contains more oxygen than nitrogen. Further, silicon nitride oxide refers to a substance that contains more nitrogen than oxygen.

An aluminum nitride film, an aluminum nitride oxide film, and a silicon nitride film which have high thermal conductivity are particularly effective in improving thermal dissipation of the transistor 100 when used for the base insulating film 102.

Since an alkali metal such as Li or Na is an impurity in the manufacturing process of the transistor 100, the amount thereof is preferably small. In the case where a glass substrate containing an impurity such as an alkali metal is used as the substrate 101, the above nitride insulating film is preferably formed as the base insulating film 102 in order to prevent entry of an alkali metal.

Since the base insulating film 102 preferably contains oxygen in a portion in contact with the oxide semiconductor film 109 formed later, in the case where any of the nitride insulating film is used for the base insulating film 102, a stacked structure may be formed by forming any of the oxide insulating film over the nitride insulating film.

In addition, since the base insulating film 102 preferably contains oxygen in a portion in contact with the oxide semiconductor film 109 formed later, an insulating film from which oxygen is released by heating may be used as the base insulating film 102. Note that the expression "oxygen is released by heating" means that the amount of released oxygen which is converted into oxygen atoms is greater than or equal to $1.0 \times 10^{18}$ cm$^{-3}$, preferably greater than or equal to $3.0 \times 10^{20}$ cm$^{-3}$, in thermal desorption spectrometry (TDS) analysis.

A method for quantifying the amount of released oxygen which is converted into oxygen atoms, with the use of TDS analysis is described below.

The amount of released gas in TDS analysis is proportional to the integral value of ion intensity. Therefore, the amount of released gas can be calculated from the ratio between the integral value of a measured ion intensity and the reference value of a standard sample. The reference value of a standard sample refers to the ratio of the predetermined density of atoms contained in the sample to the integral value of an ion intensity.

For example, the number of the released oxygen molecules ($N_{O2}$) from an insulating film can be found according to Numerical Expression 1 with the TDS analysis results of a silicon wafer containing hydrogen at a predetermined density which is the standard sample and the TDS analysis results of the insulating film. Here, all ion intensity at a mass number of 32 which are obtained by the TDS analysis are assumed to originate from an oxygen molecule. CH$_3$OH, which is given as a gas having a mass number of 32, is not taken into consideration on the assumption that it is unlikely to be present. Further, an oxygen molecule including an oxygen atom having a mass number of 17 or 18 which is an isotope of an oxygen atom is not taken into consideration either because the proportion of such a molecule in the natural world is minimal.

$$N_{O2} = N_{H2}/S_{H2} \times S_{O2} \times \alpha \quad \text{(Numerical Expression 1)}$$

$N_{H2}$ is the value obtained by conversion of the number of hydrogen molecules desorbed from the standard sample into densities. $S_{H2}$ is the integral value of ion intensity when the standard sample is subjected to TDS analysis. Here, the reference value of the standard sample is set to $N_{H2}/S_{H2}$. $S_{O2}$ is the integral value of ion intensity when the insulating film is subjected to TDS analysis. $\alpha$ is a coefficient affecting the ion intensity in the TDS analysis. Japanese Published Patent Application No. H6-275697 can be referred to for details of Numerical Expression 1. Note that the above value of the amount of released oxygen is obtained by measurement with a thermal desorption spectrometer produced by ESCO Ltd., EMD-WA1000S/W using a silicon wafer containing hydrogen atoms at $1 \times 10^{16}$ cm$^{-3}$ as the standard sample.

Further, in the TDS analysis, part of released oxygen is detected as an oxygen atom. The ratio between oxygen molecules and oxygen atoms can be calculated from the ionization rate of the oxygen molecules. Note that, since the above $\alpha$ includes the ionization rate of the oxygen molecules, the number of the released oxygen atoms can also be estimated through the evaluation of the number of the released oxygen molecules.

Note that $N_{O2}$ is the number of the released oxygen molecules. In the insulating film, the amount of released oxygen when converted into oxygen atoms is twice the number of the released oxygen molecules.

As an example of the insulating film from which oxygen is released by heating, a film of oxygen-excess silicon oxide (SiO$_X$(X>2)) is given. In the oxygen-excess silicon oxide (SiO$_X$(X>2)), the number of oxygen atoms per unit volume is more than twice the number of silicon atoms per unit volume. The number of silicon atoms and the number of oxygen atoms per unit volume are measured by Rutherford backscattering spectrometry. Note that in this embodiment, a film of oxygen-excess silicon oxide described above is used as the base insulating film 102.

Figure 3A:
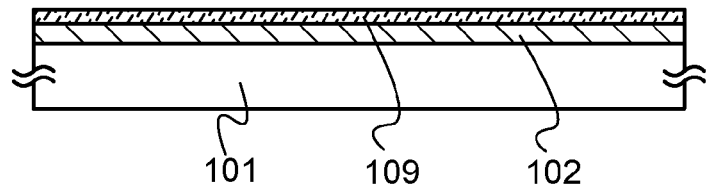
FIGS. 3A to 3E are cross-sectional views illustrating a method for manufacturing a semiconductor device according to one embodiment of the present invention.

Next, the oxide semiconductor film 109 is formed over the base insulating film 102. As the oxide semiconductor film 109, an IGZO film is formed by the formation method described in Embodiment 1 (see FIGS. 1A to 1D). The oxide semiconductor film 109 is formed to have a thickness greater than or equal to 10 nm and less than or equal to 100 nm, preferably greater than or equal to 10 nm and less than or equal to 30 nm. The structure obtained through the steps up to here is illustrated in FIG. 3A.

In the oxide semiconductor film 109 (that is to be the oxide semiconductor film 111 later), hydrogen is released by heat treatment (referred to as a first heat treatment for convenience) as described in Embodiment 1, and thus the hydrogen concentration is reduced. The hydrogen concentration is lower than $1 \times 10^{19}$ cm$^{-3}$, preferably lower than or equal to $5 \times 10^{18}$ cm$^{-3}$, which is similar to that described in Embodiment 1.

Further, when the oxide semiconductor film 109 is formed, a hydrogen permeable film including oxide such as a silicon oxide film or a silicon oxynitride film is formed as the hydrogen permeable film; thus, oxygen is supplied into the oxide semiconductor film 109 from the hydrogen permeable film. Furthermore, in the oxide semiconductor film 109 in this embodiment, oxygen is supplied from the base insulating film 102 by the first heat treatment; thus, oxygen deficiency in the oxide semiconductor film 109 is further reduced. In addition, by the first heat treatment, oxygen is also supplied in the vicinity of an interface between the base insulating film 102 and the oxide semiconductor film 109 from the base insulating film 102; thus, the interface states at the interface between the base insulating film 102 and the oxide semiconductor film 109 are also reduced.

Over the oxide semiconductor film 109, a resist mask is formed through a photolithography step, and the oxide semiconductor film 109 is etched to have a desired shape with use of the resist mask, so that an island-shaped oxide semiconductor film 110 is formed. The resist mask can be formed by an ink-jet method, a printing method, or the like as appropriate, as well as through the photolithography step. For the etching, either wet etching or dry etching may be employed, and the etching is preferably performed so that the oxide semiconductor film 110 has a side surface with a tapered shape. The side surface of the oxide semiconductor film 110 is tapered, whereby in the manufacturing process of the transistor 100, coverage with a film which is formed after this etching step can be improved, and disconnection of the film can accordingly be prevented. In the case of performing dry etching, the tapered shape can be formed by performing etching while the resist mask is made to recede.

Next, the source electrode 112a and the drain electrode 112b which are in contact with part of a top surface and side surface of the oxide semiconductor film 110 are formed. A conductive material that can be used for the source electrode 112a and the drain electrode 112b is an elemental metal such as aluminum, titanium, chromium, nickel, copper, yttrium, zirconium, molybdenum, silver, tantalum, or tungsten; or an alloy including any of these metal elements as its main component. Further, the source electrode 112a and the drain electrode 112b are formed using the above conductive material to have a single-layer structure of a stacked-layer structure. For example, a single-layer structure of an aluminum film containing silicon, a two-layer structure in which a titanium film is stacked over an aluminum film, a two-layer structure in which a titanium film is stacked over a tungsten film, a two-layer structure in which a copper film is formed over a copper-magnesium-aluminum alloy film, and a three-layer structure in which a titanium film, an aluminum film, and a titanium film are stacked in this order can be given. Note that a transparent conductive material containing indium oxide, tin oxide, or zinc oxide may be used.

A conductive film is formed using the above conductive material, a resist mask is formed over the conductive film through a photolithography step, and the conductive film is etched with use of the resist mask to have a desired shape, so that the source electrode 112a and the drain electrode 112b can be formed. Note that the resist mask can be formed by an ink-jet method, a printing method, or the like as appropriate, as well as through the photolithography step. For the etching, either wet etching or dry etching may be employed, and the etching is preferably performed so that the source electrode 112a and the drain electrode 112b have a side surface with a tapered shape. This is because in the manufacturing process of the transistor 100, coverage with a film which is formed after this etching step can be improved, and disconnection of the film can accordingly be prevented. In the case of performing dry etching, the tapered shape can be formed by performing etching while the resist mask is made to recede.

Note that the source electrode 112a and the drain electrode 112b also serve as a source wiring and a drain wiring. The thicknesses of the source electrode 112a and the drain electrode 112b can be determined as appropriate in consideration of the electric resistance of the conductive material and the time for the formation step. For example, the thicknesses of the source electrode 112a and the drain electrode 112b may be greater than or equal to 10 nm and less than or equal to 500 nm.

Figure 3B:
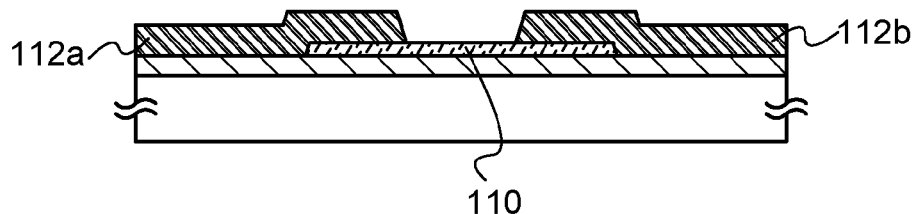

The structure obtained through the steps up to here is illustrated in FIG. 3B.

Next, the gate insulating film 114 is formed over the oxide semiconductor film 110, the source electrode 112a, and the drain electrode 112b. The gate insulating film 114 is formed to have a single-layer structure or stacked-layer structure, using a material which can be applied to the base insulating film 102. The thickness of the gate insulating film 114 is greater than or equal to 1 nm and less than or equal to 300 nm, and preferably greater than or equal to 5 nm and less than or equal to 50 nm. It is preferable that the gate insulating film 114 also contain oxygen in a portion in contact with the oxide semiconductor film 110. As the gate insulating film 114, a film from which oxygen is released by heating may be used.

A second heat treatment may be performed on a structure obtained through the steps up to here. When the second heat treatment is performed, the oxide semiconductor film 111 can be formed. By the second heat treatment, hydrogen (including water, a hydroxyl group, or a hydride) is released from the oxide semiconductor film 110, and in addition, part of oxygen contained in the base insulating film 102 and the gate insulating film 114 can be released and diffused in the oxide semiconductor film 110 (in addition, in the vicinity of the interface between the base insulating film 102 and the oxide semiconductor film 110 and in the vicinity of the interface between the oxide semiconductor film 110 and the gate insulating film 114). That is, the second heat treatment enables oxygen deficiency in the oxide semiconductor film 111, the interface states at the interface between the base insulating film 102 and the oxide semiconductor film 111, and the interface states at the interface between the oxide semiconductor film 111 and the gate insulating film 114 to be reduced.

For an apparatus used for the second heat treatment, an apparatus which can be used for the first heat treatment may be used as appropriate. As conditions of the second heat treatment, the temperature is higher than or equal to 150° C. and lower than the strain point of the substrate, preferably higher than or equal to 250° C. and lower than or equal to 450° C., further preferably higher than or equal to 300° C. and lower than or equal to 450° C., and the atmosphere is an oxidation atmosphere or an inert atmosphere. Here, the oxidation atmosphere refers to an atmosphere including an oxidation gas such as oxygen, ozone, or nitrogen oxide at 10 ppm or higher. The inert atmosphere refers to an atmosphere which includes the oxidation gas at lower than 10 ppm and is filled with nitrogen or a rare gas. The treatment time is three minutes to 24 hours. Heat treatment for longer than 24 hours is not preferable because the productivity is reduced. Note that the timing of performing the second heat treatment may be any time as long as it is after the gate insulating film 114 is formed.

Since the hydrogen concentration and oxygen deficiency in the oxide semiconductor film 111 are reduced through the first heat treatment and the second heat treatment, generation of electrons serving as a carrier is suppressed in the oxide semiconductor film 111. Thus, negative shift of the threshold voltage of the transistor 100 can be suppressed, and normally-on can be suppressed accordingly.

Furthermore, through the first heat treatment and the second heat treatment, the interface states at the interface between the base insulating film 102 and the oxide semiconductor film 111 and the interface states at the interface between the oxide semiconductor film 111 and the gate insulating film 114 are reduced. Thus, in the transistor 100, it is possible to suppress capture of electric charge generated owing to operation of the transistor 100, at the interface between the base insulating film 102 and the oxide semiconductor film 111 and the interface between the oxide semiconductor film 111 and the gate insulating film 114. Therefore, the transistor 100 can be a transistor with less deterioration of electric characteristics.

When the oxide semiconductor film 111 (which is obtained by performing etching and the second heat treatment on the oxide semiconductor film 109) is a CAAC-OS film in which the hydrogen concentration is low, a channel formation region of the transistor 100 is formed using a CAAC-OS film in which the hydrogen concentration is low. Thus, in the transistor 100, the amount of shift in the threshold voltage between before and after light irradiation (visible light or ultraviolet light) or between before and after a gate bias-temperature (BT) stress test can be small. As a result, the transistor 100 can be a transistor having stable electric characteristics and high reliability. Note that the hydrogen concentration is lower than $1\times10^{19}$ cm$^{-3}$, preferably lower than or equal to $5\times10^{18}$ cm$^{-3}$.

Further, through the first heat treatment and the second heat treatment, in the oxide semiconductor film 111, the hydrogen concentration is sufficiently reduced (high purification), and the defect level in the band gap, due to oxygen deficiency, is reduced by supplying oxygen sufficiently. As a result, the off-state current of the transistor 100 is reduced. Specifically, the off-state current (here, a value in a range where the channel length is 3 μm and the channel width is 1 μm) at room temperature (25° C.) is 100 zA (1 zA (zeptoampere) is $1\times10^{-21}$ A) or less, preferably 10 zA or less. Since alkali metal such as Li or Na is an impurity, the amount of the alkali metal which enters the transistor is preferably reduced. The concentration of the alkali metal in the oxide semiconductor film 109

(that becomes the oxide semiconductor film 110 later) is preferably lower than or equal to $2\times10^{16}$ cm$^{-3}$, preferably lower than or equal to $1\times10^{15}$ cm$^{-3}$. Further, the content of an alkaline earth metal is preferably low because it is also an impurity.

Note that if the oxide semiconductor film 109 formed through the first heat treatment is a film in which the hydrogen concentration is sufficiently lowered such that the transistor 100 having favorable electric characteristics can be manufactured and in which defect level in the band gap, due to oxygen deficiency, is sufficiently reduced, the second heat treatment for forming the oxide semiconductor film 111 may be omitted.

Figure 3C:
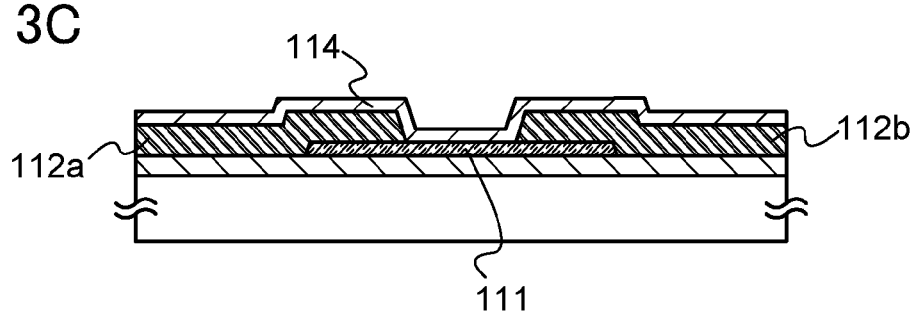

The structure obtained through the steps up to here is illustrated in FIG. 3C.

Figure 3D:
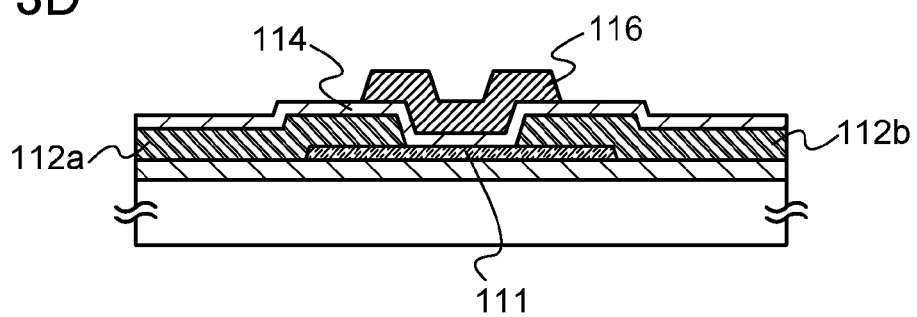

Next, the gate electrode 116 is formed over the gate insulating film 114 to overlap with the oxide semiconductor film 111. The gate electrode 116 may be formed in a manner similar to that of formation of the source electrode 112a and the drain electrode 112b. The structure obtained through the steps up to here is illustrated in FIG. 3D.

It is preferable that the gate insulating film 114 and a conductive film which is to be processed to form the gate electrode 116 later be successively formed without being exposed to air. Thus, attachment of an atmospheric component to the interface between the gate insulating film 114 and the gate electrode 116 can be suppressed, and the transistor 100 can have favorable electric characteristics.

A hydrogen capture film, particularly an oxynitride film including In, which is used for forming the oxide semiconductor film 109 may be provided between the gate insulating film 114 and the gate electrode 116. Specifically, the oxynitride film including In includes at least indium nitride and is formed using one or more materials of indium oxide, gallium oxide, zinc oxide, tin oxide, aluminum oxide, tungsten oxide, molybdenum oxide, titanium oxide, tantalum oxide, and silicon oxide. Part of hydrogen contained in the oxynitride film including In causes generation of electrons serving as a carrier. Since an electron has negative charge, the electric field is generated as in the case where extra negative bias is applied from the gate electrode, and as a result, the threshold voltage of the transistor is shifted in the positive direction. The concentration of nitrogen contained in the oxynitride film including In is controlled, whereby the hydrogen concentration in the oxynitride film including In can be controlled. Note that the hydrogen concentration in the oxynitride film can be quantified by SIMS and is higher than or equal to $1\times10^{19}$ cm$^{-3}$ and lower than or equal to $5\times10^{20}$ cm$^{-3}$, preferably higher than or equal to $1\times10^{20}$ cm$^{-3}$ and lower than or equal to $3\times10^{20}$ cm$^{-3}$. When the hydrogen concentration is controlled to the above range, the negative shift of the threshold voltage of the transistor can be suppressed.

Through the steps up to here, the transistor 100 can be manufactured.

Figure 3E:
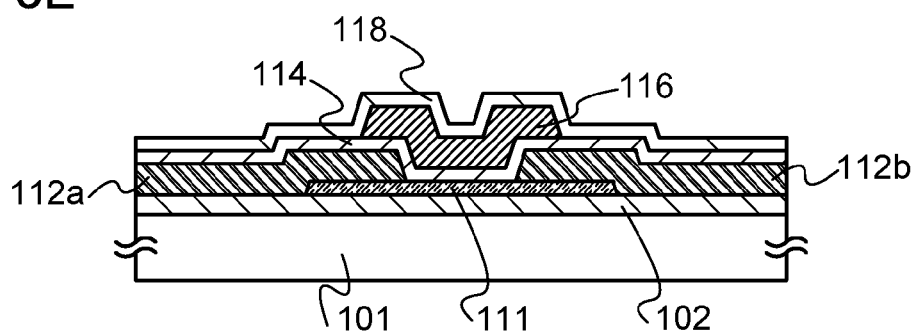

Furthermore, as illustrated in FIG. 3E, a protective insulating film 118 may be provided over the gate insulating film 114 and the gate electrode 116. The protective insulating film 118 may be formed using a silicon oxide film, a silicon oxynitride film, a silicon nitride oxide film, or a silicon nitride film by a sputtering method, a CVD method, or the like. Here, it is preferable that a film from which oxygen is less likely to be released by heating be used for the protective insulating film 118. This is for prevention against a decrease in the conductivity of the oxide semiconductor film 111. Specifically, the protective insulating film 118 may be formed by a CVD method with use of a mixture which includes a silane gas as a main material and a proper source gas selected from a nitrogen oxide gas, a nitrogen gas, a hydrogen gas, and a rare gas. The substrate temperature at the time of film formation may be set to higher than or equal to 300° C. and lower than or equal to 550° C. By using a CVD method, the film from which oxygen is less likely to be released by heating can be formed.

Note that an opening portion is formed in the gate insulating film 114 and the protective insulating film 118 as necessary, so that the gate electrode 116, the source electrode 112a, and the drain electrode 112b are exposed.

As described above, a semiconductor device can be manufactured with use of the method for forming an oxide semiconductor film according to one embodiment. Further, the semiconductor device includes an oxide semiconductor film having favorable semiconductor characteristics and thus has favorable electric characteristics.

Note that the structure described in this embodiment can be combined with structures described in the other embodiments and example of this specification, as appropriate.

(Embodiment 3)

In this embodiment, a liquid crystal display device manufactured using the transistor described in Embodiment 2 will be described. Note that an example in which one embodiment of the present invention is applied to a liquid crystal display device will be described in this embodiment; however, the present invention is not limited to this embodiment. For example, application of one embodiment of the present invention to an electroluminescence (EL) display device which is one of light-emitting devices is readily conceived by those skilled in the art.

Figure 4:
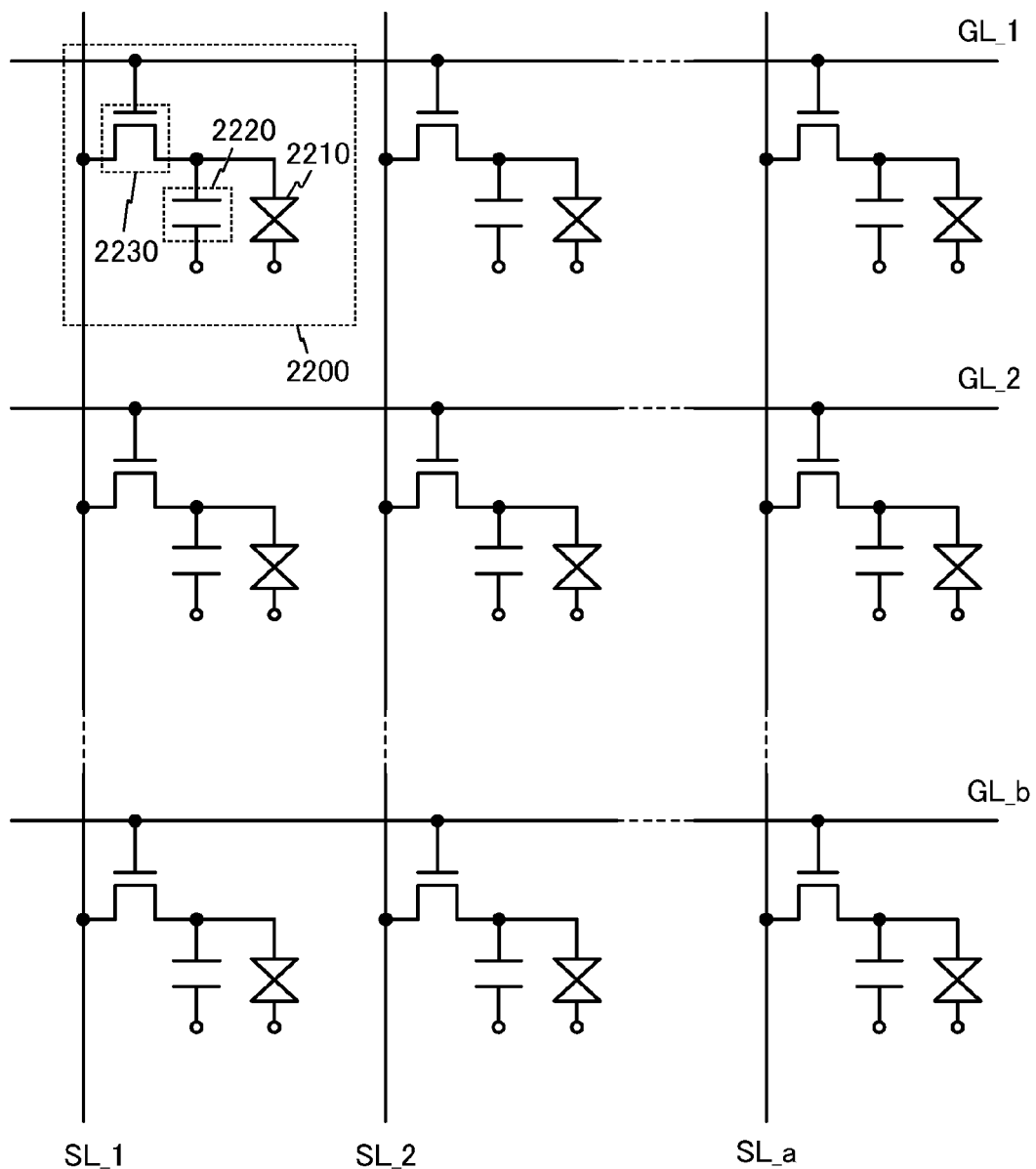
FIG. 4 shows an example of a circuit diagram of a liquid crystal display device including a transistor according to one embodiment of the present invention.

FIG. 4 is a circuit diagram of an active matrix liquid crystal display device. The liquid crystal display device includes source lines SL_1 to SL_a, gate lines GL_1 to GL_b, and a plurality of pixels 2200. Each pixel 2200 includes a transistor 2230, a capacitor 2220, and a liquid crystal element 2210. The plurality of pixels 2200 with such a structure forms a pixel portion of the liquid crystal display device. In the case where the source line or the gate line is simply mentioned, it is denoted as the source line SL or the gate line GL.

As the transistor 2230, the transistor described in Embodiment 2, which is one embodiment of the present invention, is used. Since the transistor described in Embodiment 2 has favorable electric characteristics such as high field-effect mobility, a display device having high display quality can be obtained. In addition, since the transistor described in Embodiment 2 has extremely small off-state current, a display device with low power consumption can be obtained.

The gate line GL is connected to a gate of the transistor 2230, the source line SL is connected to a source of the transistor 2230, and a drain of the transistor 2230 is connected to one of capacitor electrodes of the capacitor 2220 and one of pixel electrodes of the liquid crystal element 2210. The other capacitor electrode of the capacitor 2220 and the other pixel electrode of the liquid crystal element 2210 are connected to a common electrode. Note that the common electrode may be formed in the same layer as the gate line GL using the same material as the gate line GL.

Further, the gate line GL is connected to a gate driver circuit. The gate driver circuit may include the transistor described in Embodiment 2.

The source line SL is connected to a source driver circuit. The source driver circuit may include the transistor described in Embodiment 2.

Note that one of or both the gate driver circuit and the source driver circuit may be formed over a separately prepared substrate and connected using a method such as chip on glass (COG), wire bonding, or tape automated bonding (TAB).

Further, since a transistor is easily broken by static electricity or the like, a protection circuit is preferably provided for the display device. The protection circuit is preferably formed using a nonlinear element.

When a voltage is applied to the gate line GL to be higher than or equal to the threshold voltage of the transistor 2230, electric charge supplied from the source line SL flows as a drain current of the transistor 2230 and is stored in the capacitor 2220. After charging for one row, the transistors 2230 in the row are turned off and voltage application from the source line SL stops; however, a necessary voltage can be kept by the electric charge accumulated in the capacitors 2220. Then, charging of the capacitors 2220 in the next row starts. In this manner, charging for the first row to the b-th row is carried out.

Note that in the case where a transistor whose off-state current is small is used as the transistor 2230, a time period during which the capacitor 2220 holds the voltage can be longer. By this effect, the display rewriting frequency can be reduced in the case of displaying an image with little motion (including a still image); accordingly, power consumption can be further lowered. In addition, capacitance of the capacitor 2220 can be further reduced, so that power consumption needed for charging can be reduced.

As described above, according to one embodiment of the present invention, a liquid crystal display device with high display quality, high reliability, and low power consumption can be provided.

(Embodiment 4)

In this embodiment, an example of manufacturing a semiconductor memory device using the transistor described in Embodiment 2 will be described.

As typical examples of a volatile semiconductor memory device, there are a dynamic random access memory (DRAM) which stores data in such a manner that a transistor included in a memory element is selected and electric charge is accumulated in a capacitor, and a static random access memory (SRAM) which holds stored data using a circuit such as a flip-flop.

As a typical example of a nonvolatile semiconductor memory device, there is a flash memory which includes a floating gate between a gate electrode and a channel formation region in a transistor and stores data by holding electric charge in the floating gate.

The transistor described in Embodiment 2 can be applied to some of transistors included in the above-described semiconductor memory device.

First, a memory cell included in a semiconductor memory device to which the transistor described in Embodiment 2 is applied will be described with reference to FIGS. 5A and 5B.

Figure 5A:
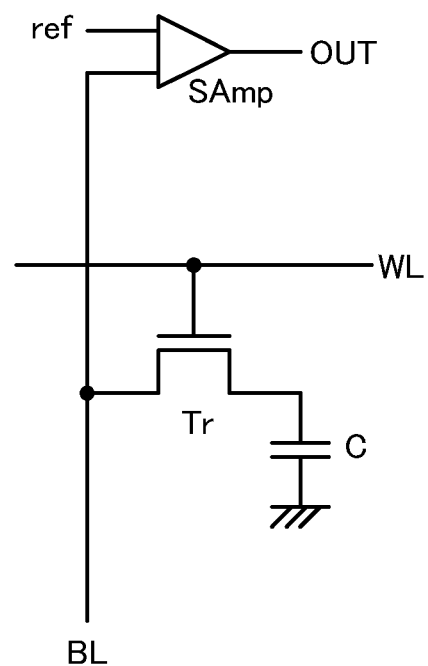
FIG. 5A shows an example of a circuit diagram of a semiconductor memory device according to one embodiment of the present invention and FIG. 5B is a graph showing change over time in voltage held by a capacitor.

A memory cell includes a bit line BL, a word line WL, a sense amplifier SAmp, a transistor Tr, and a capacitor C (see FIG. 5A).

Figure 5B:
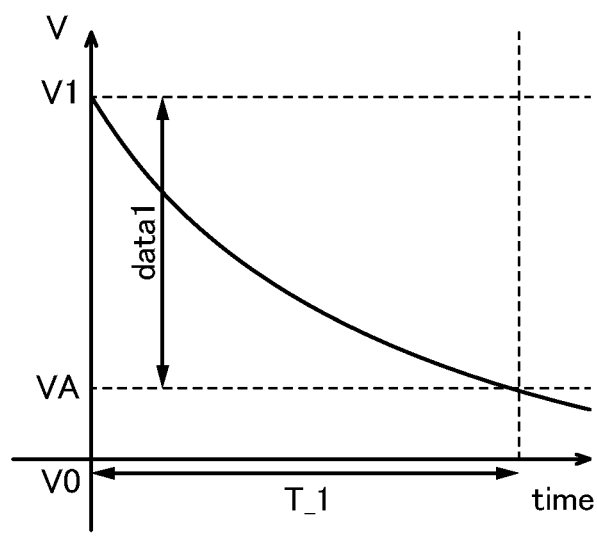

It is known that the voltage held by the capacitor C is gradually reduced over time due to the off-state current of the transistor Tr as shown in FIG. 5B. After a certain period of time, the voltage originally charged from V0 to V1 is decreased to VA which is a limit for reading data 1. This period is called a holding period T_1. In the case of a two-level memory cell, refresh needs to be performed within the holding period T_1.

When the transistor described in Embodiment 2 is employed as the transistor Tr, the holding period T_1 can be made longer because the off-state current is small. That is, the frequency of refresh operation can be reduced. Accordingly, consumed power can be reduced. For example, when a memory cell is formed using a transistor in which a highly purified oxide semiconductor film is included and the off-state current is less than or equal to $1\times10^{-21}$ A, preferably less than or equal to $1\times10^{-24}$ A, data can be held for several days to several decades without supply of power.

As described above, according to one embodiment of the present invention, a semiconductor memory device with high reliability and low power consumption can be obtained.

Next, a memory cell in a nonvolatile semiconductor memory device to which the transistor described in Embodiment 2 will be described with reference to FIGS. 6A and 6B.

Figure 6A:
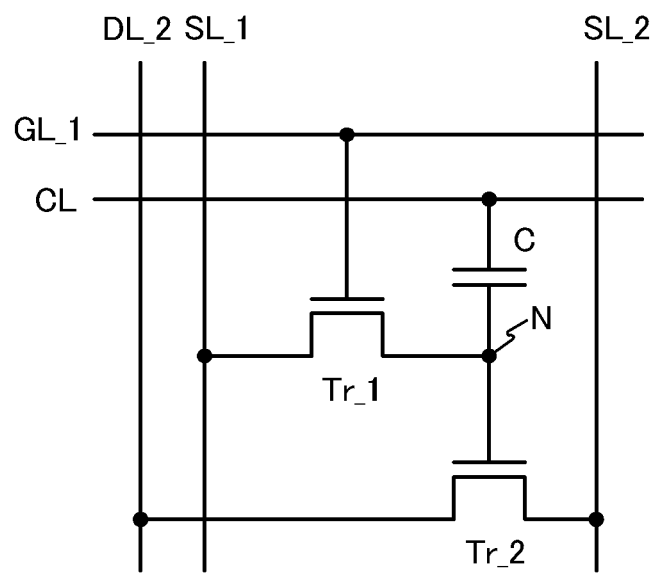
FIG. 6A shows an example of a circuit diagram of a semiconductor memory device according to one embodiment of the present invention and FIG. 6B is a graph showing a relation between the drain current and the voltage of a capacitor wiring.
Figure 6B:
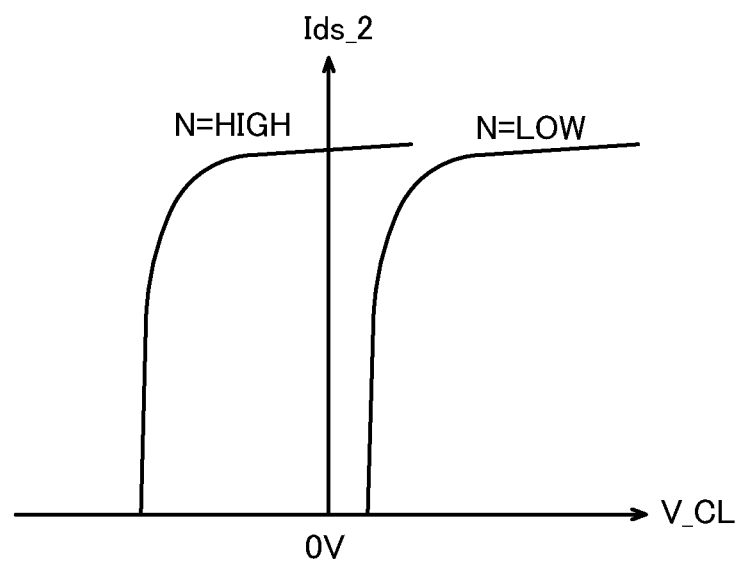

FIG. 6A is a circuit diagram of the memory cell. A memory cell includes a transistor Tr_1, a gate wiring GL_1 connected to a gate of the transistor Tr_1, a source wiring SL_1 connected to a source of the transistor Tr_1, a transistor Tr_2, a source wiring SL_2 connected to a source of the transistor Tr_2, a drain wiring DL_2 connected to a drain of the transistor Tr_2, a capacitor C, a capacitor wiring CL connected to one terminal of the capacitor C, and a node N connected to the other terminal of the capacitor C, a drain of the transistor Tr_1, and a gate of the transistor Tr_2.

The memory cell shown in FIG. 6A utilizes change in the threshold voltage of the transistor Tr_2, which depends on the voltage of the node N. For example, FIG. 6B shows a relation between a voltage V_CL of the capacitor wiring CL and a drain current Ids_2 flowing through the transistor Tr_2.

The voltage at the node N can be controlled with the transistor Tr_1. For example, the voltage of the source wiring SL_1 is set to VDD. In this case, when the voltage of the GL_1 is set to be higher than or equal to a voltage obtained by adding VDD to the threshold voltage Vth of the transistor Tr_1, the voltage of the node N can be HIGH. Further, when the voltage of the GL_1 is set to be lower than or equal to the threshold voltage Vth of the transistor Tr_1, the voltage of the node N can be LOW.

Thus, either a V_CL-Ids_2 curve (N=LOW) or a V_CL-Ids_2 curve (N=HIGH) is obtained. That is, when N=LOW, Ids_2 is small at a V_CL of 0 V; accordingly, data 0 is stored. Further, when N=HIGH, Ids_2 is large at a V_CL of 0V; accordingly, data 1 is stored. In this manner, data can be stored.

Since the off-state current of a transistor can be made to be extremely small in the case where the transistor described in Embodiment 2 is used as the transistor Tr_1 here, unintentional leak of electric charge accumulated in the node N by flowing between the source and the drain of the transistor Tr_1 can be suppressed. Therefore, data can be held for a long period. By using one embodiment of the present invention, the threshold voltage of the transistor Tr_1 is controlled, which enables reduction in the voltage necessary for writing. Thus, power consumption can be made small as compared with that of a flash memory or the like.

Note that the transistor described in Embodiment 2 may also be applied to the transistor Tr_2.

As described above, according to one embodiment of the present invention, a semiconductor memory device with high integration degree, high reliability for a long period, and low power consumption can be obtained.

This embodiment can be implemented in appropriate combination with the other embodiments.

(Embodiment 5)

A central processing unit (CPU) can be formed using the transistor described in Embodiment 2 for at least part of the CPU.

Figure 7A:
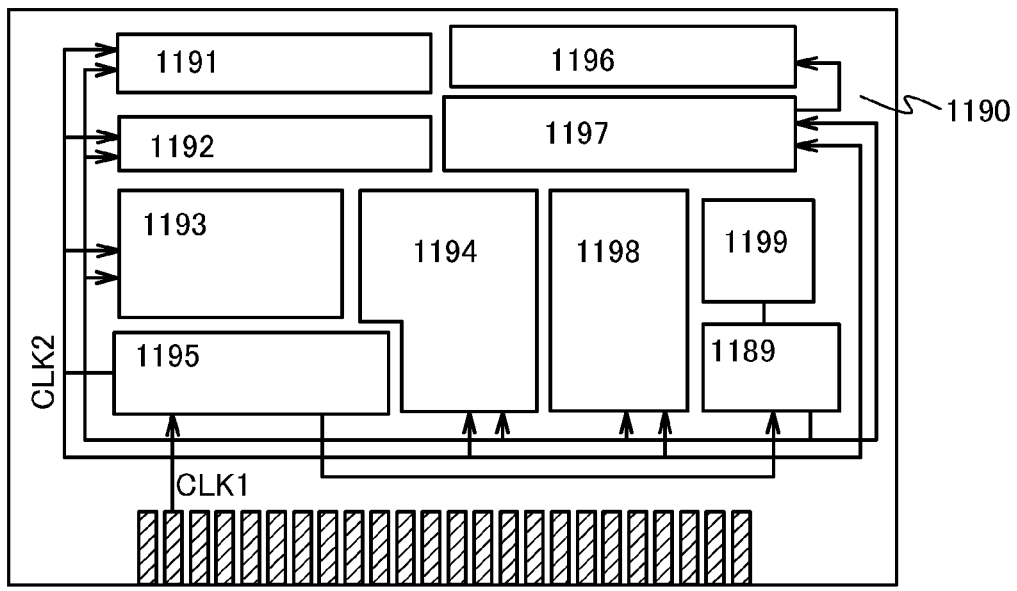
FIG. 7A is a block diagram showing a specific example of a CPU including a transistor according to one embodiment of the present invention and FIGS. 7B and 7C are circuit diagrams each illustrating part of the CPU.

FIG. 7A is a block diagram illustrating a specific structure of a CPU. The CPU illustrated in FIG. 7A includes an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and an ROM interface (ROM I/F) 1189 over a substrate 1190. A semiconductor substrate, an SOI substrate, a glass substrate, or the like is used as the substrate 1190. The ROM 1199 and the ROM interface 1189 may be provided over a separate chip. Obviously, the CPU illustrated in FIG. 7A is only an example in which the structure is simplified, and a variety of structures is applied to an actual CPU depending on the application.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the clock signal CLK2 to the above circuits.

In the CPU illustrated in FIG. 7A, a memory element is provided in the register 1196. As the memory element in the register 1196, any of memory elements described in Embodiment 4 can be used.

In the CPU illustrated in FIG. 7A, the register controller 1197 selects operation of holding data in the register 1196 in accordance with an instruction from the ALU 1191. That is, the register controller 1197 determined whether data is held by a phase-inversion element or by a capacitor in the memory element included in the register 1196. When data holding by the phase-inversion element is selected, power supply voltage is supplied to the memory element in the register 1196. When data holding by the capacitor is selected, the data is rewritten in the capacitor, and supply of power supply voltage to the memory element in the register 1196 can be stopped.

Figure 7B:
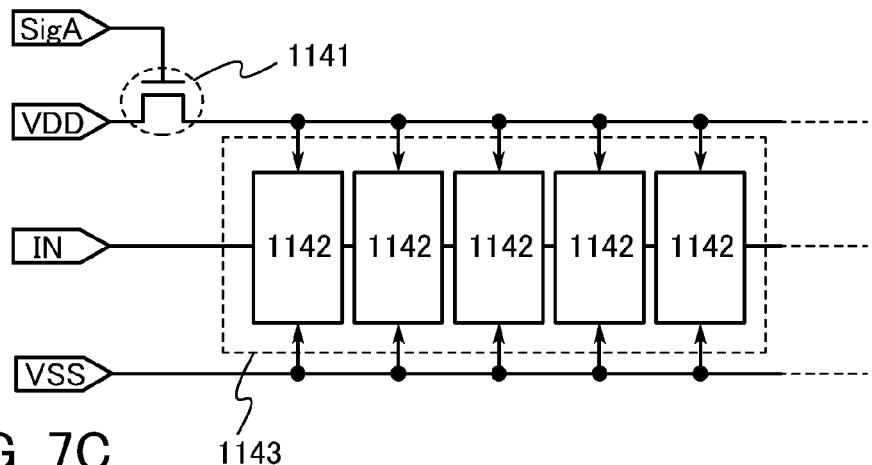
Figure 7C:
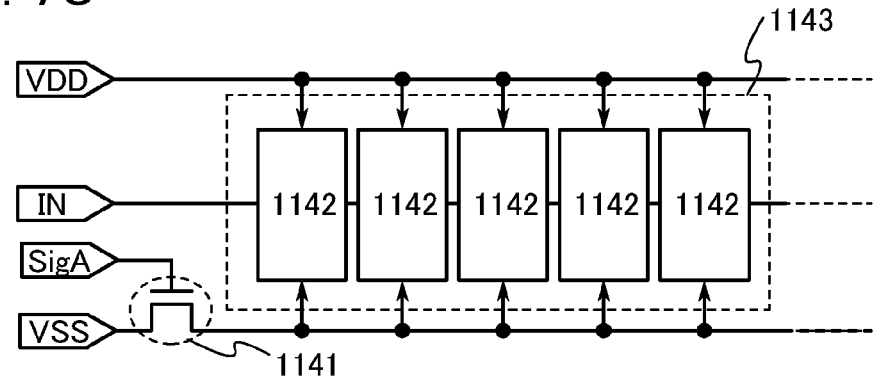

The power supply can be stopped by a switching element provided between a memory element group and a node to which a power supply potential VDD or a power supply potential VSS is supplied, as illustrated in FIG. 7B or FIG. 7C. Circuits illustrated in FIGS. 7B and 7C are described below.

FIGS. 7B and 7C each illustrate an example of a structure of a memory circuit in which a transistor whose active layer is formed using an oxide semiconductor is used as a switching element for controlling supply of a power supply potential to a memory element.

The memory device illustrated in FIG. 7B includes a switching element 1141 and a memory element group 1143 including a plurality of memory elements 1142. Specifically, as each of the memory elements 1142, the memory element described in Embodiment 4 can be used. Each of the memory elements 1142 included in the memory element group 1143 is supplied with the high-level power supply potential VDD via the switching element 1141. Further, each of the memory elements 1142 included in the memory element group 1143 is supplied with a potential of a signal IN and the low-level power supply potential VSS.

In FIG. 7B, a transistor whose active layer includes a semiconductor with a wide band gap, such as an oxide semiconductor, is used as the switching element 1141, and the switching of the transistor is controlled by a signal SigA supplied to a gate thereof.

Note that FIG. 7B illustrates the structure in which the switching element 1141 includes only one transistor; however, without limitation thereto, the switching element 1141 may include a plurality of transistors. In the case where the switching element 1141 includes a plurality of transistors which serve as switching elements, the plurality of transistors may be connected to each other in parallel, in series, or in combination of parallel connection and series connection.

Although the switching element 1141 controls the supply of the high-level power supply potential VDD to each of the memory elements 1142 included in the memory element group 1143 in FIG. 7B, the switching element 1141 may control the supply of the low-level power supply potential VSS.

In FIG. 7C, an example of a memory device in which each of the memory elements 1142 included in the memory element group 1143 is supplied with the low-level power supply potential VSS via the switching element 1141 is illustrated. The supply of the low-level power supply potential VSS to each of the memory elements 1142 included in the memory element group 1143 can be controlled by the switching element 1141.

When a switching element is provided between a memory element group and a node to which the power supply potential VDD or the power supply potential VSS is supplied, data can be held even in the case where an operation of a CPU is temporarily stopped and the supply of the power supply voltage is stopped; accordingly, power consumption can be reduced. For example, while a user of a personal computer does not input data to an input device such as a keyboard, the operation of the CPU can be stopped, so that the consumed power can be reduced.

Although the CPU is given as an example, the transistor can also be applied to an LSI such as a digital signal processor (DSP), a custom LSI, or a field programmable gate array (FPGA).

This embodiment can be implemented in appropriate combination with the other embodiments.

(Embodiment 6)

A semiconductor device disclosed in this specification can be applied to a variety of electronic devices (including game machines). Examples of electronic devices are a television device (also referred to as a television or a television receiver), a monitor of a computer or the like, a camera such as a digital camera or a digital video camera, a digital photo frame, a mobile phone (also referred to as a mobile telephone or a mobile phone device), a portable game console, a portable information terminal, an audio reproducing device, a large-sized game machine such as a pachinko machine, and the like.

Figure 8A:
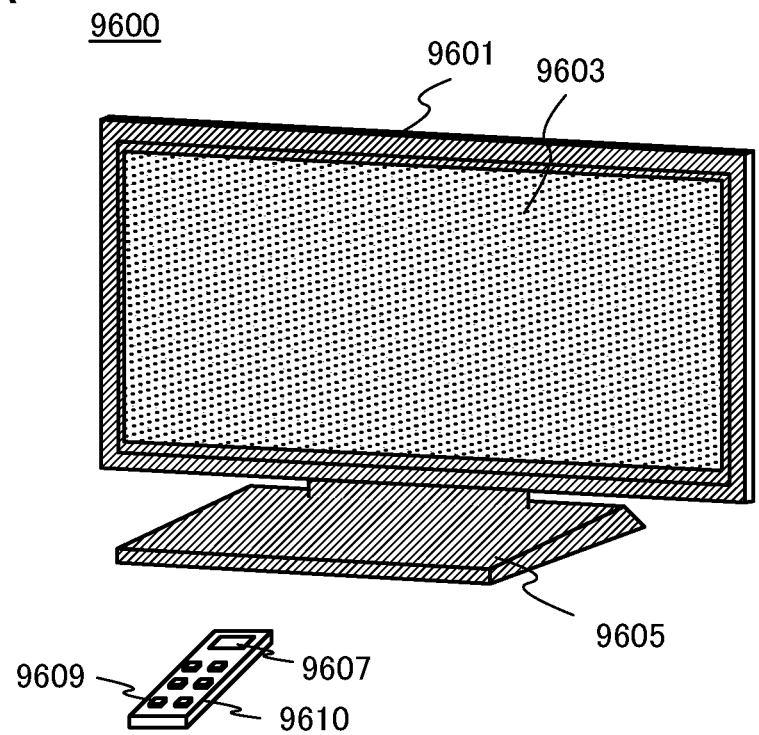
FIGS. 8A and 8B are external views illustrating examples of a television device and a digital photo frame.

FIG. 8A illustrates an example of a television device. In a television device 9600, a display portion 9603 is incorporated in a housing 9601. The display portion 9603 can display images. Here, the housing 9601 is supported by a stand 9605. One embodiment of the present invention can be applied to the display portion 9603. By applying one embodiment of the present invention, a television device which consumes less power even when the size of the display portion 9603 is increased can be provided.

The television device 9600 can be operated with an operation switch of the housing 9601 or a separate remote controller 9610. Channels and volume can be controlled with an operation key 9609 of the remote controller 9610 so that an image displayed on the display portion 9603 can be controlled. Furthermore, the remote controller 9610 may be provided with a display portion 9607 for displaying data output from the remote controller 9610.

Note that the television device 9600 is provided with a receiver, a modem, and the like. With the use of the receiver, general television broadcasting can be received. Moreover, when the display device is connected to a communication network with or without wires via the modem, one-way (from a sender to a receiver) or two-way (between a sender and a receiver or between receivers) information communication can be performed.

Figure 8B:
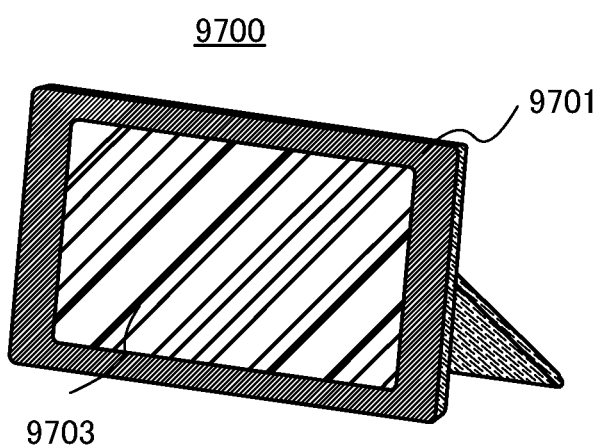

FIG. 8B illustrates an example of a digital photo frame. For example, in a digital photo frame 9700, a display portion 9703 is incorporated in a housing 9701. One embodiment of the present invention can be applied to the display portion 9703. By applying one embodiment of the present invention, a digital photo frame which consumes less power even when the size of the display portion 9703 is increased can be provided. The display portion 9703 can display a variety of images. For example, the display portion 9703 can display data of an image taken with a digital camera or the like and function as a normal photo frame.

Note that the digital photo frame 9700 is provided with an operation portion, an external connection portion (a USB terminal, a terminal that can be connected to various cables such as a USB cable, or the like), a recording medium insertion portion, and the like. Although these components may be provided on the surface on which the display portion is provided, it is preferable to provide them on the side surface or the back surface for the design of the digital photo frame 9700. For example, a memory storing data of an image taken with a digital camera is inserted in the recording medium insertion portion of the digital photo frame, whereby the image data can be transferred and then displayed on the display portion 9703.

The digital photo frame 9700 may be configured to transmit and receive data wirelessly. The structure may be employed in which desired image data is transferred wirelessly to be displayed.

This embodiment can be implemented by being combined as appropriate with any of the above-described embodiments.

EXAMPLE 1

In this example, evaluation results of the hydrogen concentration in an oxide semiconductor film which was formed according to Embodiment 1 will be described. Note that the oxide semiconductor film is referred to as Sample A.

First, a method for forming Sample A is described with reference to FIGS. 1A to 1D.

A quartz substrate was used as the substrate 101. The oxide semiconductor film 103 was formed to a thickness 300 nm over the substrate 101 by a sputtering method (see FIG. 1A). In this example, an IGZO film was formed as the oxide semiconductor film 103. The IGZO film was formed under the following conditions: an argon gas at 30 sccm and an oxygen gas at 15 sccm were supplied to a reaction chamber of a sputtering apparatus; the pressure in the reaction chamber was set to 0.4 Pa; the electric power was set to 0.5 kW; the temperature of the substrate 101 was set to 200° C.; and a target where $In_2O_3$: $Ga_2O_3$: ZnO=1:1:2 [molar ratio] was used.

Next, a 5-nm-thick silicon oxide film, which is the hydrogen permeable film 105, was formed over the oxide semiconductor film 103 by a sputtering method. The oxide silicon film was formed under the following conditions: an argon gas at 25 sccm and an oxygen gas at 25 sccm were supplied to a reaction chamber of a sputtering apparatus; the pressure in the reaction chamber was set to 0.4 Pa; the electric power was set to 1.0 kW; the temperature of the substrate 101 was set to 100° C.; and a $SiO_2$ target was used.

Next, a 300-nm-thick oxynitride film, which is the hydrogen capture film 107, was formed over the hydrogen permeable film 105 by a sputtering method (see FIG. 1B). In this example, an IGZON film was formed as the oxynitride film. The IGZON film was formed under the following conditions; an nitrogen gas at 40 sccm was supplied to a reaction chamber of a sputtering apparatus; the pressure in the reaction chamber was set to 0.4 Pa; the electric power was set to 0.5 kW; the temperature of the substrate 101 was set to 200° C.; and a target where $In_2O_3$: $Ga_2O_3$: ZnO=1:1:2 [molar ratio] was used.

Next, heat treatment was performed on an object obtained through the steps up to here (see FIG. 1C). The heat treatment was performed at a temperature of 550° C. in a nitrogen atmosphere for an hour. The object which had been subjected to the heat treatment was Sample A, and another object which had not been subjected to the heat treatment was a comparative example. The comparative example was manufactured through the same process as Sample A, except for the heat treatment.

Figure 9:
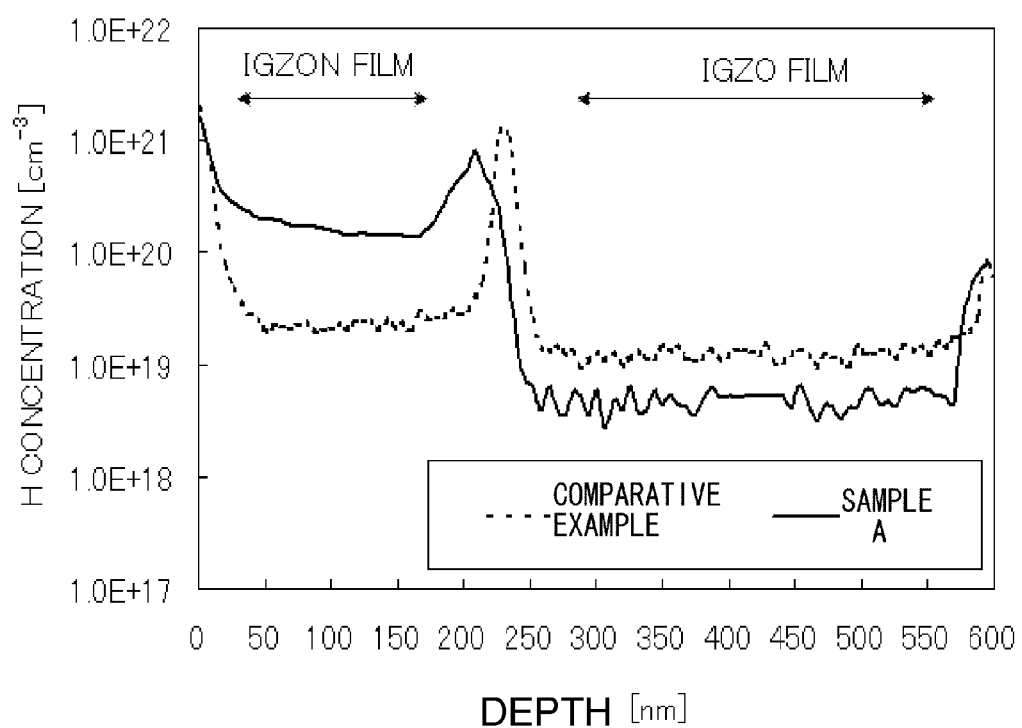
FIG. 9 shows a concentration profile of hydrogen contained in an oxide semiconductor film.

Next, the hydrogen concentration in Sample A was evaluated by SIMS, and the results thereof are shown in FIG. 9. In FIG. 9, the vertical axis indicates the hydrogen concentration in Sample A or the comparative example, and the horizontal axis indicates a depth from a surface (surface of the IGZON film) toward the substrate, of Sample A or the comparative example. Further, the solid line represents a profile of the hydrogen concentration in Sample A, and the broken line represents a profile of the hydrogen concentration in the comparative example. As for Sample A and the comparative example, a highly reliable value of the hydrogen concentration in the IGZO film is in a range of 300 nm to 550 nm in the horizontal axis, and a highly reliable value of the hydrogen concentration in the IGZON film is in a range of 50 nm to 150 nm in the horizontal axis. A peak existing in a range of 200 nm to 250 nm in the horizontal axis is generated due to a small thickness (5 nm) of the silicon oxide film. The reliability of the hydrogen concentration in this range is low. Further, values of the hydrogen concentration around 600 nm in the horizontal axis are due to the quartz substrate (substrate 101).

FIG. 9 shows that in the range corresponding to the IGZO film, the hydrogen concentration of the Sample A is lower than that in the comparative example. In addition, in the range corresponding to the IGZON film, the hydrogen concentration of Sample A is higher than that in the comparative example.

As described above, it was found that when an oxide silicon film and an IGZON film are formed over an IGZO film and heat treatment is performed, hydrogen in the IGZO film is released, penetrates the oxide silicon film, and captured by the IGZON film.

According to this example, the following was confirmed: a hydrogen permeable film is formed over an oxide semiconductor film, a hydrogen capture film is formed over the hydrogen permeable film, and heat treatment is performed, so that hydrogen can be released from the oxide semiconductor film and captured by the hydrogen capture film, and thus, an oxide semiconductor film in which the hydrogen concentration is reduced can be formed.

This application is based on Japanese Patent Application Ser. No. 2011-067693 filed with Japan Patent Office on Mar. 25, 2011, the entire contents of which are hereby incorporated by reference.

What is claimed is:

1. A method for forming a semiconductor device comprising the steps of:
   forming an oxide semiconductor film which includes a region to become a channel formation region;
   forming a hydrogen permeable film over the oxide semiconductor film, the hydrogen permeable film comprising silicon and oxygen;
   forming a hydrogen capture film over the hydrogen permeable film, the hydrogen capture film comprising indium, oxygen, and nitrogen;
   transferring hydrogen from the oxide semiconductor film to the hydrogen capture film by performing heat treatment; and
   removing the hydrogen capture film and the hydrogen permeable film,
   wherein the hydrogen permeable film is an insulating film.

2. The method for forming a semiconductor device according to claim 1,
   wherein the hydrogen permeable film and the hydrogen capture film are removed after the heat treatment.

3. The method for forming a semiconductor device according to claim 1,
   wherein the hydrogen capture film comprises a metal element included in the oxide semiconductor film, and
   wherein the hydrogen permeable film does not include the metal element.

4. The method for forming a semiconductor device according to claim 1,
   wherein the oxide semiconductor film comprises an In—Ga—Zn—O film,
   wherein the hydrogen capture film comprises an In–Ga—Zn—O—N film.

5. The method for forming a semiconductor device according to claim 1,
   wherein a thickness of the hydrogen permeable film is less than or equal to 5 nm.

6. The method for forming a semiconductor device according to claim 1,
   wherein a hydrogen concentration in the hydrogen capture film increases after the heat treatment, and
   wherein a hydrogen concentration in the oxide semiconductor film is lower than or equal to $5 \times 10^{18}$ cm$^{-3}$ after the heat treatment.

7. A method for forming a semiconductor device comprising the steps of:
   forming an oxide semiconductor film, which includes a region to become a channel formation region;
   forming a hydrogen permeable film over the oxide semiconductor film, the hydrogen permeable film comprising silicon and oxygen;
   forming a hydrogen capture film over the hydrogen permeable film, the hydrogen capture film comprising indium, oxygen, and nitrogen;
   transferring hydrogen from the oxide semiconductor film to the hydrogen capture film and supplying oxygen to the oxide semiconductor film from the hydrogen permeable film by performing heat treatment; and
   removing the hydrogen capture film and the hydrogen permeable film,
   wherein the hydrogen permeable film is an insulating film.

8. The method for forming a semiconductor device according to claim 7,
   wherein the hydrogen permeable film and the hydrogen capture film are removed after the heat treatment.

9. The method for forming a semiconductor device according to claim 7,
   wherein the hydrogen capture film comprises a metal element included in the oxide semiconductor film, and
   wherein the hydrogen permeable film does not include the metal element.

10. The method for forming a semiconductor device according to claim 7,
    wherein the oxide semiconductor film comprises an In—Ga—Zn—O film,
    wherein the hydrogen capture film comprises an In—Ga—Zn—O—N film.

11. The method for forming a semiconductor device according to claim 7,
    wherein a thickness of the hydrogen permeable film is less than or equal to 5 nm.

12. The method for forming a semiconductor device according to claim 7,
    wherein a hydrogen concentration in the hydrogen capture film increases after the heat treatment, and
    wherein a hydrogen concentration in the oxide semiconductor film is lower than or equal to $5 \times 10^{18}$ cm$^{-3}$ after the heat treatment.

13. A method for forming a semiconductor device comprising the steps of:
    forming a first oxide semiconductor film;
    forming a hydrogen permeable film over the first oxide semiconductor film, the hydrogen permeable film comprising silicon and oxygen;
    forming a hydrogen capture film over the hydrogen permeable film, the hydrogen capture film comprising indium, oxygen, and nitrogen;
    transferring hydrogen from the first oxide semiconductor film to the hydrogen capture film by performing heat treatment;
    removing the hydrogen capture film and the hydrogen permeable film; and
    patterning the first oxide semiconductor film to form a second oxide semiconductor film which includes a region to become a channel formation region.

14. The method for forming a semiconductor device according to claim 1,
    wherein the hydrogen capture film comprises indium nitride and one or more materials of indium oxide, gallium oxide, zinc oxide, tin oxide, aluminum oxide.

15. The method for forming a semiconductor device according to claim 7,
    wherein the hydrogen capture film comprises indium nitride and one or more materials of indium oxide, gallium oxide, zinc oxide, tin oxide, aluminum oxide.

16. The method for forming a semiconductor device according to claim 13,
    wherein the hydrogen capture film comprises indium nitride and one or more materials of indium oxide, gallium oxide, zinc oxide, tin oxide, aluminum oxide.

17. The method for forming a semiconductor device according to claim 1,
    wherein the oxide semiconductor film comprises indium and zinc.

18. The method for forming a semiconductor device according to claim 7,
   wherein the oxide semiconductor film comprises indium and zinc.

19. The method for forming a semiconductor device according to claim 13,
   wherein the first oxide semiconductor film comprises indium and zinc.

20. The method for forming a semiconductor device according to claim 1,
   wherein the hydrogen permeable film comprises a silicon oxide film or a silicon oxynitride film.

21. The method for forming a semiconductor device according to claim 7,
   wherein the hydrogen permeable film comprises a silicon oxide film or a silicon oxynitride film.

* * * * *